US010642226B2

(12) United States Patent
Hayashi et al.

(10) Patent No.: US 10,642,226 B2
(45) Date of Patent: May 5, 2020

(54) ATOMIC OSCILLATOR AND FREQUENCY SIGNAL GENERATION SYSTEM

(71) Applicant: Seiko Epson Corporation, Tokyo (JP)

(72) Inventors: Nobuhito Hayashi, Chino (JP); Koji Chindo, Chino (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 16/295,330

(22) Filed: Mar. 7, 2019

(65) Prior Publication Data

US 2019/0278231 A1 Sep. 12, 2019

(30) Foreign Application Priority Data

Mar. 8, 2018 (JP) ................. 2018-042187

(51) Int. Cl.
G04F 5/14 (2006.01)
H03L 1/04 (2006.01)
H03L 7/26 (2006.01)
H03B 17/00 (2006.01)

(52) U.S. Cl.
CPC ............. *G04F 5/14* (2013.01); *G04F 5/145* (2013.01); *H03B 17/00* (2013.01); *H03L 1/04* (2013.01); *H03L 7/26* (2013.01)

(58) Field of Classification Search
CPC ... G04F 5/145; G04F 5/14; H03L 7/26; H03B 17/00; H01S 1/06
See application file for complete search history.

(56) References Cited

U.S. PATENT DOCUMENTS

| 2011/0187466 | A1 | 8/2011 | Youngner et al. |
| 2015/0180492 | A1 | 6/2015 | Yoshida et al. |
| 2015/0214895 | A1 | 7/2015 | Hashi |
| 2016/0352345 | A1 | 12/2016 | Hashi |
| 2017/0279455 | A1* | 9/2017 | Maki ........ G04F 5/14 |

(Continued)

FOREIGN PATENT DOCUMENTS

| JP | 2012-195788 A | 10/2012 |
| JP | 5616752 B2 | 10/2014 |
| JP | 2015-119443 A | 6/2015 |

(Continued)

OTHER PUBLICATIONS

G.F. Weston, "Ultrahigh Vacuum Practice", Philips Research Laboratories, Butterworth & Co., Ltd. (Publishers), 1985, pp. 1-188.

(Continued)

Primary Examiner — Ryan Johnson
(74) Attorney, Agent, or Firm — Harness, Dickey & Pierce, P.L.C.

(57) ABSTRACT

An atomic oscillator includes a light source, an atom cell containing a gaseous alkali metal atom, and a nitrogen- and argon-containing buffer gas, and through which light from the light source passes, a photodetector that detects light having passed through the atom cell, and a container containing nitrogen gas and housing the atom cell. The container has a first surface, a second surface, a third surface, a fourth surface, a fifth surface, and a sixth surface. The first surface has a first through hole. At least one of the second surface, the third surface, the fourth surface, the fifth surface, and the sixth surface has a second through hole.

11 Claims, 13 Drawing Sheets

(56) References Cited

U.S. PATENT DOCUMENTS

2019/0109597 A1* 4/2019 Matsuda ............... H03L 7/26

FOREIGN PATENT DOCUMENTS

| JP | 2015-142240 A | 8/2015 |
| JP | 2016-225751 A | 12/2016 |
| JP | 2017-059865 A | 3/2017 |
| JP | 2017-112515 A | 6/2017 |

OTHER PUBLICATIONS

O. Kozlova et al., "Temperature Dependence of a CS Vapor Cell Clock: Pressure Shift, Signal Amplitude, Light Shift", LNE-SYRTE, Observatoire de Paris, 2011, pp. 1-5.

S. Abdullah et al., "Aging Studies on Micro-Fabricated Alkali Buffer-Gas Cells for Miniature Atomic Clocks", Published in Applied Physics Letters, 106, 163505-1/5, 2015, pp. 1-5.

Wikipedia, the Free Encyclopedia, "Glass", Theories and Definition, pp. 1-13 with English translation, Oct. 2018.

* cited by examiner

ATOMIC OSCILLATOR AND FREQUENCY SIGNAL GENERATION SYSTEM

CROSS-REFERENCE TO RELATED APPLICATIONS

This application claims priority to Japanese Patent Application No. 2018-042187, filed Mar. 8, 2018, the entirety of which is hereby incorporated by reference.

BACKGROUND

1. Technical Field

The present invention relates to an atomic oscillator, and a frequency signal generation system.

2. Related Art

An atomic oscillator as a frequency signal generator is known that includes a light source; an atom cell charged with alkali metal atoms such as cesium; a photodetector for detecting light having passed through the atom cell; and a container housing the light source, the atom cell, and the photodetector. The atomic oscillator oscillates as a result of an energy transition of alkali metal atoms.

For example, JP-A-2015-119443 describes a gas cell having an internal space charged with metal atoms and a buffer gas. The buffer gas is a mixed gas of nitrogen gas and argon gas, and the molar fraction of the argon gas in the mixed gas is adjusted in a range of 15% to 40% to achieve desirable temperature characteristics.

However, when the atmosphere inside the container housing the atom cell is atmospheric air, there are cases where substances with small molecular weights, such as helium, enter the atom cell through it. This causes fluctuations in the frequency of the atomic oscillator. It is accordingly desirable to charge the container with a large-molecular-weight gas, specifically, nitrogen gas or argon gas. However, the gas passage becomes uneven, and displacement of the atmospheric air in the container becomes difficult to achieve when the supply hole for supplying gas is provided in the same surface of the container where a discharge hole is formed.

SUMMARY

An atomic oscillator according to an aspect of the invention includes: a light source that emits light; an atom cell charged with a gaseous alkali metal atom, and a nitrogen- and argon-containing buffer gas, and through which the light passes; a photodetector that detects the light having passed through the atom cell; and a container charged with nitrogen gas and housing the atom cell, in which the container has opposing first and second surfaces, opposing third and fourth surfaces, and opposing fifth and sixth surfaces, the first surface has a first through hole, at least one of the second surface, the third surface, and the fourth surface, the fifth surface, and the sixth surface has a second through hole.

In the atomic oscillator according to the aspect of the invention, the first through hole may be a hole for supplying the nitrogen gas, the light source and the atom cell may be disposed on the same side of an imaginary plane as the first through hole, and the imaginary plane may be a plane that passes through a center of the container, and is parallel to the first surface.

An atomic oscillator according to an aspect of the invention includes: a light source that emits light; an atom cell charged with a gaseous alkali metal atom, and a nitrogen- and argon-containing buffer gas, and through which the light passes; a photodetector that detects the light having passed through the atom cell; and a container charged with argon gas and housing the atom cell, in which the container has opposing first and second surfaces, opposing third and fourth surfaces, and opposing fifth and sixth surfaces, the first surface has a first through hole, and at least one of the second surface, the third surface, the fourth surface, the fifth surface, and the sixth surface has a second through hole.

In the atomic oscillator according to the aspect of the invention, the first through hole may be a hole for supplying the argon gas, the light source and the atom cell may be disposed on the same side of an imaginary plane as the first through hole, and the imaginary plane may be a plane that passes through a center of the container, and is parallel to the first surface.

In the atomic oscillator according to the aspect of the invention, the first through hole may be disposed on the opposite side of the imaginary plane from the second through hole.

In the atomic oscillator according to the aspect of the invention, the first through hole may be disposed on the opposite side of another imaginary plane from the second through hole, and the imaginary plane may be a plane that passes through the center of the container, and is perpendicular to the first surface.

In the atomic oscillator according to the aspect of the invention, the third surface may join the first surface, and that the second through hole may be provided in the third surface.

A frequency signal generation system according to an aspect of the invention includes an atomic oscillator, in which the atomic oscillator includes: a light source that emits light; an atom cell charged with a gaseous alkali metal atom, and a nitrogen- and argon-containing buffer gas, and through which the light passes; a photodetector that detects the light having passed through the atom cell; and a container charged with nitrogen gas and housing the atom cell, the container has opposing first and second surfaces, opposing third and fourth surfaces, and opposing fifth and sixth surfaces, the first surface has a first through hole, and at least one of the second surface, the third surface, the fourth surface, the fifth surface, and the sixth surface has a second through hole.

A frequency signal generation system according to an aspect of the invention includes an atomic oscillator, in which the atomic oscillator includes: a light source that emits light; an atom cell charged with a gaseous alkali metal atom, and a nitrogen- and argon-containing buffer gas, and through which the light passes; a photodetector that detects the light having passed through the atom cell; and a container charged with argon gas and housing the atom cell, the container has opposing first and second surfaces, opposing third and fourth surfaces, and opposing fifth and sixth surfaces, the first surface has a first through hole, and at least one of the second surface, the third surface, the fourth surface, the fifth surface, and the sixth surface having a second through hole.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention are described below in detail, with reference to the accompanying drawings. It is to be noted that the embodiments below are not intended to unduly limit the substance of the invention recited in the appended claims. The configurations described below also do not necessarily represent all the necessary configurations of the invention.

1. First Embodiment

1.1. Atomic Oscillator 1.1.1. Overview

Figure 1:
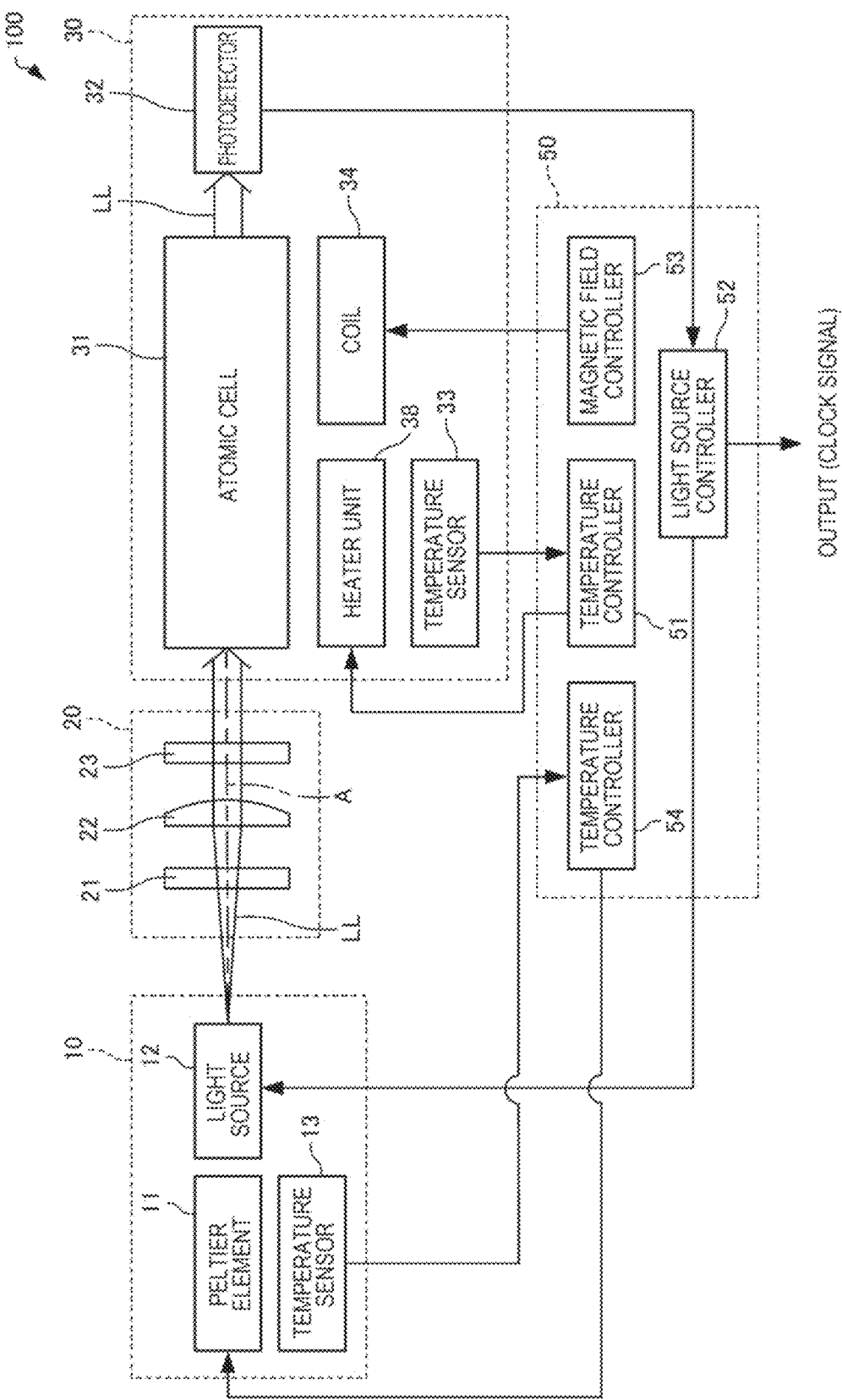
FIG. 1 is a schematic diagram representing an atomic oscillator according to First Embodiment.

An atomic oscillator according to First Embodiment is described below, with reference to the accompanying drawings. FIG. 1 is a schematic diagram representing an atomic oscillator 100 according to the present embodiment.

The atomic oscillator 100 is an atomic oscillator that takes advantage of the quantum interfere effect (CPT: Coherent Population Trapping), a phenomenon in which two rays of resonance light of different specific wavelengths simultaneously applied to an alkali metal atom pass through the alkali metal atom without being absorbed. This phenomenon based on the quantum interfere effect is also called electromagnetically induced transparency, or EIT for short. The atomic oscillator according to the embodiment of the invention may be an atomic oscillator that takes advantage of the double resonance phenomenon using light and microwaves.

As shown in FIG. 1, the atomic oscillator 100 includes a light source unit 10, an optical system unit 20, an atom cell unit 30, and a control unit 50 that controls the light source unit 10 and the atom cell unit 30. First, the atomic oscillator 100 is briefly described below.

The light source unit 10 includes a Peltier element 11, a light source 12, and a temperature sensor 13.

The light source 12 emits linearly polarized light LL comprised of two light components of different frequencies. The light source 12 is a light-emitting device such as a vertical cavity surface emitting laser (VCSEL). The temperature sensor 13 detects the temperature of the light source 12. The Peltier element 11 is a first temperature controller that brings the light source 12 to a first temperature. Specifically, the Peltier element 11 heats or cools the light source 12. The first temperature is, for example, 25° C. to 35° C.

The optical system unit 20 is disposed between the light source unit 10 and the atom cell unit 30. The optical system unit 20 includes a dark filter 21, a lens 22, and a ¼ wavelength plate 23.

The dark filter 21 reduces the intensity of the light LL emitted by the light source 12. The lens 22 adjusts the emission angle of the light LL. Specifically, the lens 22 produces parallel rays of light LL. The ¼ wavelength plate 23 converts the two components of light LL of different frequencies from linearly polarized light to circularly polarized light.

The atom cell unit 30 includes an atom cell 31 through which the light LL emitted by the light source 12 passes, a photodetector 32, a heater unit 38, a temperature sensor 33, and a coil 34.

The atom cell 31 contains alkali metal atoms. The alkali metal atoms have three energy levels including two different base levels, and an excitation level. The light LL emitted by the light source 12 is incident on the atom cell 31 through the dark filter 21, the lens 22, and the ¼ wavelength plate 23.

The photodetector 32 receives and detects the light LL through the atom cell 31. The photodetector 32 is, for example, a photodiode.

The heater unit 38 represents a second temperature controller that brings the atom cell 31 to a second temperature different from the first temperature. The heater unit 38 heats the alkali metal atoms contained in the atom cell 31, and brings at least some of the alkali metal atoms to a gaseous state. The second temperature is, for example, 60° C. to 70° C.

The temperature sensor 33 detects the temperature of the atom cell 31. The coil 34 applies a magnetic field of a predetermined direction to the alkali metal atoms contained in the atom cell 31 to split the energy levels of the alkali metal atoms by the Zeeman effect.

Applying a circularly polarized resonance light pair to the alkali metal atoms after Zeeman splitting produces relatively larger numbers of alkali metal atoms of the desired energy level than alkali metal atoms of other energy levels split by the Zeeman effect. This increases the number of atoms that develop the desired EIT phenomenon, and enhances the desired EIT signal. The result is the atomic oscillator 100 having improved oscillation characteristics.

The control unit 50 includes a temperature controller 51, a light source controller 52, a magnetic field controller 53, and a temperature controller 54.

By using the detection result from the temperature sensor 33, the temperature controller 51 controls the applied current to the heater unit 38 so as to bring inside of the atom cell 31 to the desired temperature. The magnetic field controller 53 controls the applied current to the coil so that the coil 34 can generate a constant magnetic field. By using the detection result from the temperature sensor 33, the temperature controller 54 controls the applied current to the Peltier element 11 so as to bring the light source 12 to the desired temperature.

By using the detection result from the photodetector 32, the light source controller 52 controls the frequencies of the two components of the light LL emitted by the light source 12 so that the EIT phenomenon can take place. The EIT phenomenon occurs when these two components of light become a resonance light pair having a frequency difference that corresponds to the energy difference between the two ground levels of the alkali metal atoms contained in the atom cell 31. The light source controller 52 includes a voltage controlled oscillator (VCO; not illustrated) that controls and stabilizes the oscillation frequency in synchronism with the frequency control of the two light components. The light source controller 52 outputs the output signal of the voltage controlled oscillator as an output signal (clock signal) of the atomic oscillator 100.

1.1.2. Specific Configuration

Figure 2:
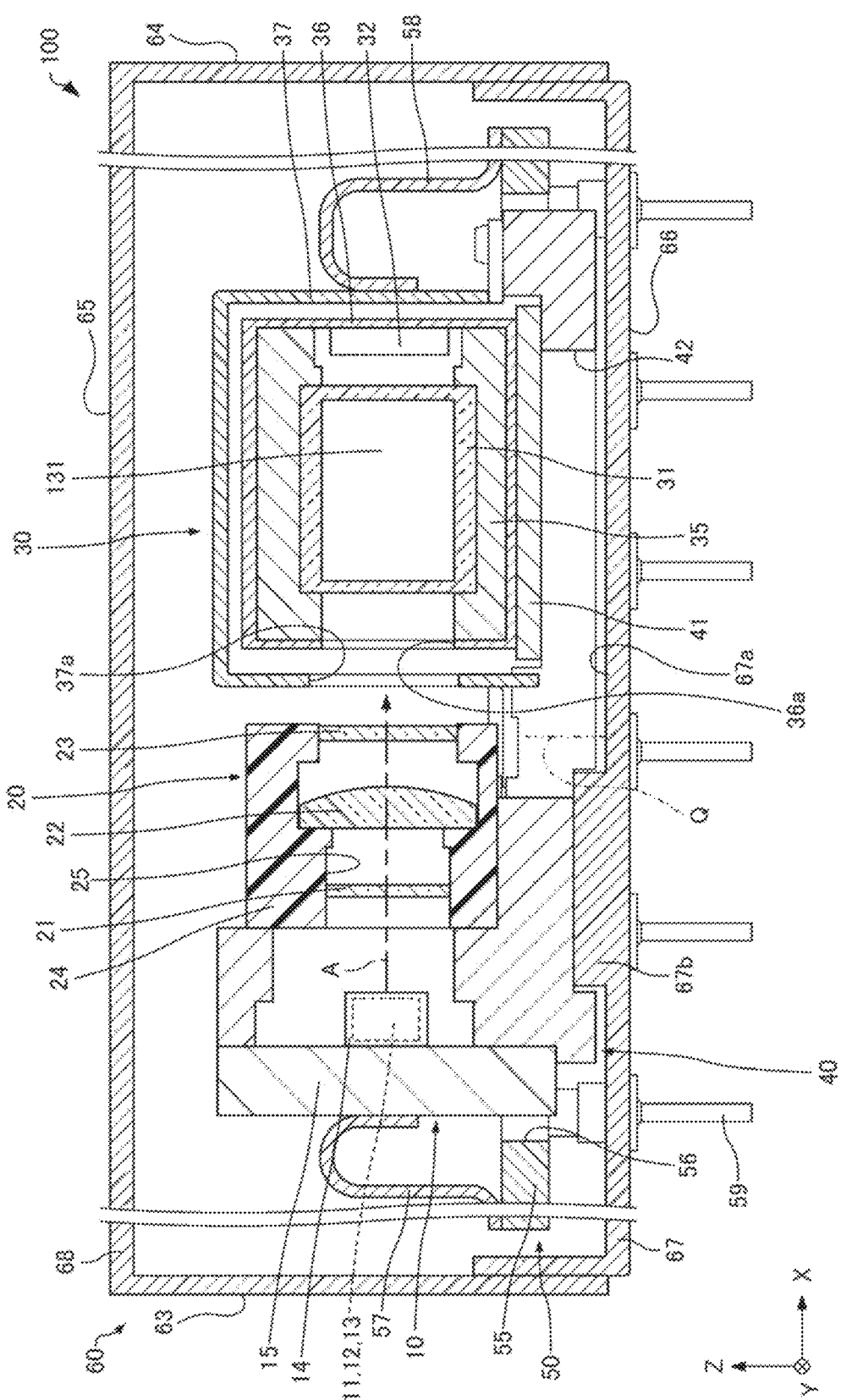
FIG. 2 is a cross sectional view schematically representing the atomic oscillator according to First Embodiment.
Figure 3:
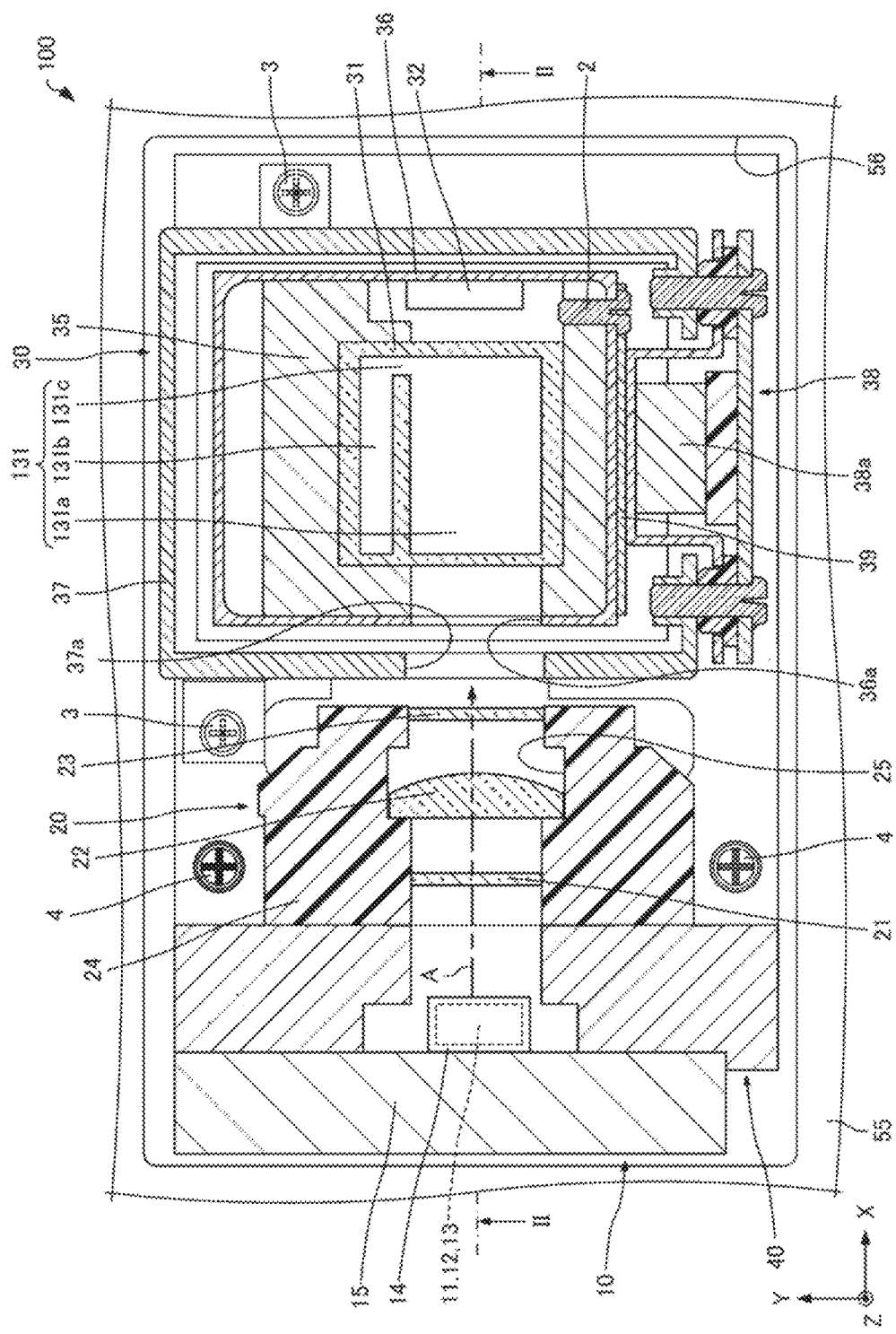
FIG. 3 is a cross sectional view schematically representing the atomic oscillator according to First Embodiment.

The following describes a specific configuration of the atomic oscillator 100. FIGS. 2 and 3 are cross sectional views schematically representing the atomic oscillator 100. FIG. 2 is a cross sectional view at line II-II of FIG. 3. In FIGS. 2 and 3, and in FIGS. 4 to 8 described below, the X axis, Y axis, and Z axis are orthogonal to each other.

As illustrated in FIGS. 2 and 3, the atomic oscillator 100 includes the light source unit 10, the optical system unit 20, the atom cell unit 30, a support member 40, the control unit 50, and an outer container 60.

Here, the Z axis is an axis along the normal line Q of an inner surface 67a of a base 67 of the outer container 60. The direction from the inner surface 67a toward the components disposed on the inner surface 67a is +Z axis direction. The X axis is an axis along the light LL emitted by the light source unit 10. The propagation direction of light LL is +X axis direction. The Y axis is an axis perpendicular to the X and Z axes. With the +Z axis direction pointing upward, and the +X axis direction pointing rightward, +Y axis direction is a direction into the plane of the paper.

The light source unit 10 is disposed on the support member 40. The light source unit 10 includes the Peltier element 11, the light source 12, the temperature sensor 13, a light source container 14 housing these members, and a light source substrate 15 on which the light source container 14 is disposed. The light source substrate 15 is fixed to the support member 40 with, for example, a screw (not illustrated). The Peltier element 11, the light source 12, and the temperature sensor 13 are electrically connected to the control unit 50.

The optical system unit 20 is disposed on the support member 40. The optical system unit 20 includes the dark filter 21, the lens 22, the ¼ wavelength plate 23, and a holder 24 holding these members. The holder 24 is fixed to the support member 40 with, for example, a screw (not illustrated).

The holder 24 has a through hole 25. The through hole 25 is where passage of the light LL takes place. The dark filter 21, the lens 22, and the ¼ wavelength plate 23 are disposed in the through hole 25, in this order from the light source unit 10 side.

The atom cell unit 30 includes the atom cell 31, the photodetector 32, a retainer 35, a first atom cell container 36, a second atom cell container 37, and the heater unit 38.

The atom cell 31 contains alkali metal atoms, for example, such as a rubidium, a cesium, and a sodium, in gaseous form. The light LL emitted by the light source 12 is incident on the atom cell 31. The material of the atom cell 31 is, for example, glass.

As illustrated in FIG. 3, the atom cell 31 defines an internal space 131 that includes a first space 131a, a second space 131b, and a communication channel 131c through which the first space 131a and the second space 131b are in communication with each other. The first space 131a is larger in volume than the second space 131b. The light LL emitted by the light source 12 passes through the first space 131a.

The temperature of the second space 131b is adjusted to a temperature below the temperature of the first space 131a. To this end, liquid alkali metal atoms (not illustrated) are present in the second space 131b. The liquid alkali metal atoms evaporate when the gaseous alkali metal atoms in the first space 131a decrease by, for example, reacting with the atom cell 31. In this way, the concentration of the gaseous alkali metal atoms can remain constant in the first space 131a.

The photodetector 32 is disposed on the side of the atom cell 31 opposite the light source 12. In the example represented in the figure, the photodetector 32 is disposed on the first atom cell container 36. The photodetector 32 is electrically connected to the control unit 50.

The retainer 35 holds the atom cell 31 inside the first atom cell container 36. In the example represented in the figure, the retainer 35 is fixed to the first atom cell container 36 with a screw 2. The retainer 35 is structured to allow for passage of the light LL emitted by the light source 12. The material of the retainer 35 is, for example, aluminum, titanium, copper, or brass.

The first atom cell container 36 houses the atom cell 31, the photodetector 32, and the retainer 35. The first atom cell container 36 has a substantially rectangular outer shape. The first atom cell container 36 has a through hole 36a through which the light LL passes. In the example represented in FIG. 2, the first atom cell container 36 is supported on the support member 40 via a support board 41. The material of the first atom cell container 36 is, for example, permalloy or ferrosilicon. By being made of such materials, the first atom cell container 36 is able to block an external magnetic field. In this way, the influence of an external magnetic field on the alkali metal atoms in the atom cell 31 can be reduced, and the atomic oscillator 100 can have stable oscillation characteristics.

For example, a heat transfer member 39 is disposed on an outer surface of the first atom cell container 36. The heat transfer member 39 is disposed between the first atom cell container 36 and the heater unit 38. The heat transfer member 39 transfers the heat of the heater unit 38 to the alkali metal atoms in the atom cell 31. The material of the heat transfer member 39 is, for example, aluminum or copper.

The second atom cell container 37 houses the first atom cell container 36. As illustrated in FIG. 3, the second atom cell container 37 is fixed to the support member with, for example, screws 3. The second atom cell container 37 has a through hole 37a through which the light LL passes.

For example, the second atom cell container 37 is made of the same material exemplified for the first atom cell container 36. Accordingly, the second atom cell container 37 is able to block an external magnetic field. For example, the first atom cell container 36 and the second atom cell container 37 are separated from each other. This enables the first atom cell container 36 and the second atom cell container 37 to block an external magnetic field more effectively than when, for example, these containers are in contact with each other.

The heater unit 38 is in contact with, for example, the heat transfer member 39. The heater unit 38 has a heater 38a. The heater 38a is a device for heating the alkali metal atoms present in the atom cell 31. The heater 38a is, for example, a heating resistor. The heater 38a may use a Peltier element, in addition to, or instead of, the heating resistor.

The temperature sensor 33 is disposed in the vicinity of the atom cell 31, though not illustrated in FIGS. 2 and 3. The temperature sensor 33 is selected from various types of temperature sensors, for example, such as a thermistor, and a thermocouple.

The coil 34 is, for example, a solenoid coil provided around the atom cell 31, or a pair of Helmholtz coils provided on opposing sides of the atom cell 31, though not illustrated in FIGS. 2 and 3. The coil 34 generates a magnetic field along the optical axis A of the light LL, inside the atom cell 31. By Zeeman splitting, the generated magnetic field widens the gap between different degenerated energy levels of the alkali metal atoms contained in the atom cell 31. This makes it possible to improve the resolution, and reduce the line width of the EIT signal.

As illustrated in FIG. 2, the support member 40 is fixed to the base 67 of the outer container 60 in a cantilever fashion. For example, the support member 40 is fixed to the seat 67b of the base 67 with two screws 4, as illustrated in FIG. 3. The material of the support member 40 is, for example, aluminum or copper. The support member 40 may be a carbon sheet using carbon fiber. The support member 40 may be fixed to the base 67 with an adhesive.

As illustrated in FIG. 2, the support member 40 has, for example, a through hole 42. In the example represented in FIG. 2, the through hole 42 penetrates through the support member 40 in Z axis direction. The atom cell unit 30 lies over the through hole 42 as viewed in Z axis direction.

The control unit 50 has a circuit board 55. The circuit board 55 is fixed to the base 67 of the outer container 60 with a plurality of lead pins 59. IC (Integrated Circuit) chips (not illustrated) are disposed on the circuit board 55. The IC chips function as the temperature controller 51, the light source controller 52, the magnetic field controller 53, and the temperature controller 54. The IC chips are electrically connected to the light source unit 10 and the atom cell unit 30. The circuit board 55 has a through hole 56 through which the support member 40 is inserted. The light source unit 10, the optical system unit 20, and the atom cell unit 30 lie over the through hole 56 as viewed in plan.

The control unit 50 also includes a first flexible wiring board 57 that joins the circuit board 55 to the light source unit 10, and a second flexible wiring board 58 that joins the circuit board 55 to the atom cell unit 30. For simplicity, the flexible wiring boards 57 and 58 are omitted in FIG. 3.

The outer container 60 houses the light source unit 10, the optical system unit 20, the atom cell unit 30, the support member 40, and the control unit 50. That is, the outer container 60 houses the atom cell 31. The outer container 60 has the base 67, and a cover 68, which is separately provided from the base 67.

For example, the outer container 60 is made of the same material exemplified for the first atom cell container 36. Accordingly, the outer container 60 is able to block external magnetism, and the influence of external magnetism on the alkali metal atoms present in the atom cell 31 can be reduced.

Figure 4:
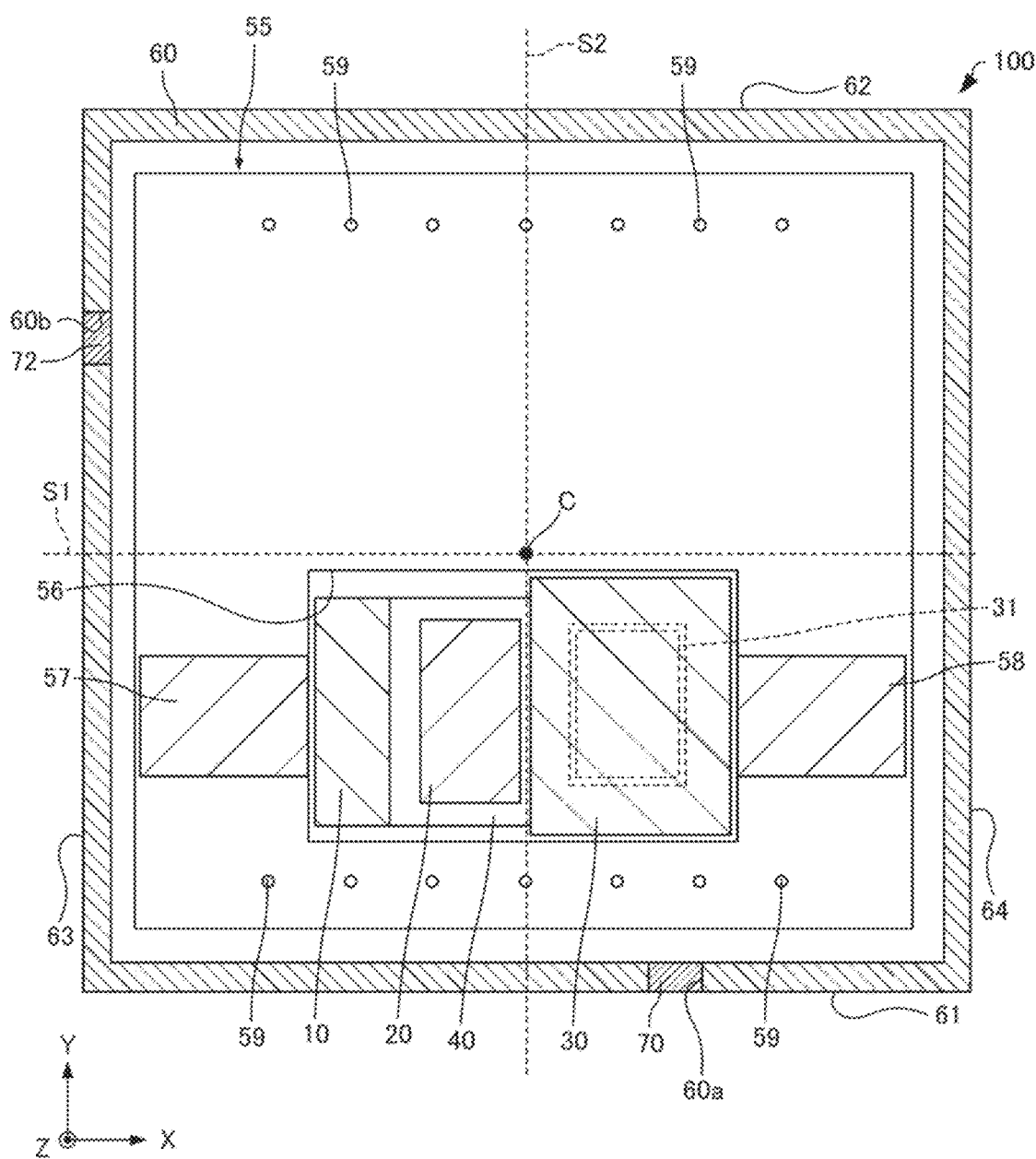
FIG. 4 is a cross sectional view schematically representing the atomic oscillator according to First Embodiment.
Figure 5:
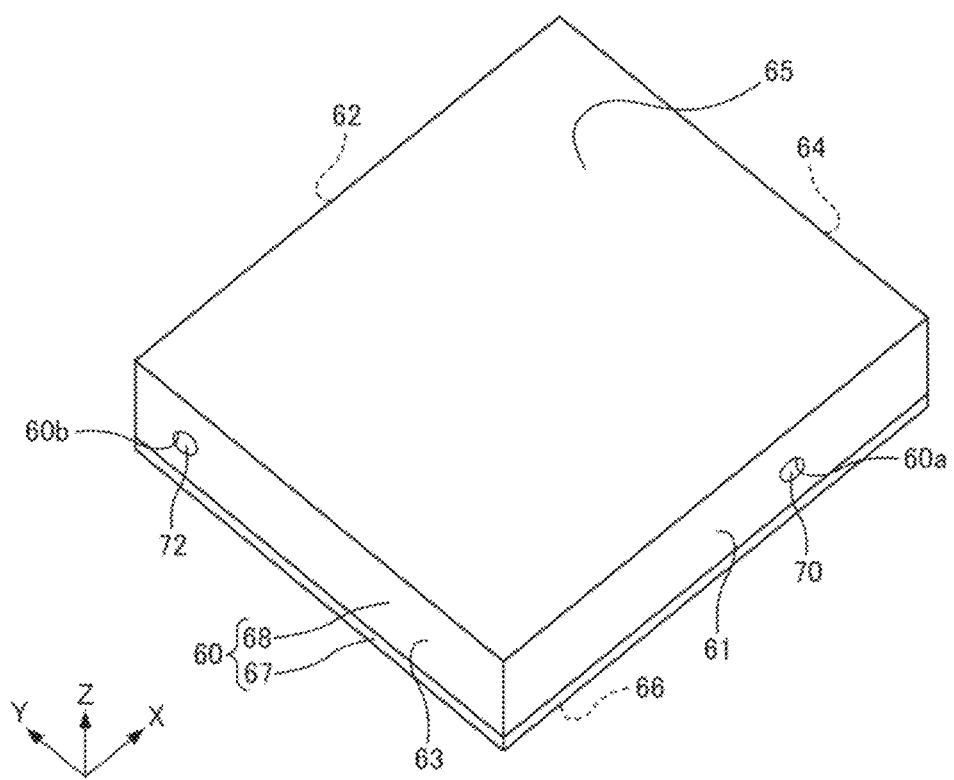
FIG. 5 is a perspective view schematically representing the atomic oscillator according to First Embodiment.

FIG. 4 is a cross sectional view schematically representing the atomic oscillator 100. FIG. 5 is a perspective view schematically representing the atomic oscillator 100. As a matter of convenience, FIG. 4 shows the light source unit 10, the optical system unit 20, the atom cell unit 30, and the support member 40 in a simplified fashion.

As illustrated in FIGS. 4 and 5, the outer container 60 has a first surface 61, a second surface 62, a third surface 63, a fourth surface 64, a fifth surface 65, and a sixth surface 66. The surfaces 61, 62, 63, 64, 65, and 66 represent the outer surfaces of the container 60. The surfaces 61, 62, 63, 64, and 65 represent, for example, the surfaces of the cover 68. The sixth surface 66 represents, for example, a surface of the base 67. For example, the outer container 60 is substantially rectangular in shape.

The first surface 61 and the second surface 62 are opposite each other. In the example represented in the figure, the surfaces 61 and 62 are parallel to each other, and are oriented in Y axis direction. The third surface 63 and the fourth surface 64 are opposite each other. In the example represented in the figure, the surfaces 63 and 64 are parallel to each other, and are oriented in X axis direction. The surfaces 63 and 64 join the surfaces 61 and 62. In the example represented in the figure, the surfaces 63 and 64 are orthogonal to the surfaces 61 and 62. The fifth surface 65 and the sixth surface 66 are opposite each other. In the example represented in the figure, the surfaces 65 and 66 are parallel to each other, and are oriented in Z axis direction. The fifth surface 65 joins the surfaces 61, 62, 63, and 64. In the example represented in the figure, the fifth surface 65 is orthogonal to the surfaces 61, 62, 63, and 64.

The first surface 61 has a first through hole 60a. A second through hole 60b is provided in at least one of the second surface 62, the third surface 63, the fourth surface 64, the fifth surface 65, and the sixth surface 66. In the example represented in the figure, the second through hole 60b is provided in the third surface 63. The second through hole 60b is not provided in the first surface 61. In the example represented in FIG. 5, the through holes 60a and 60b are ellipsoidal in shape; however, the shape of these holes is not particularly limited. The through holes 60a and 60b are provided through side walls of the outer container 60. In the example represented in the figure, the through holes 60a and 60b are single through holes.

As illustrated in FIG. 4, the first through hole 60a is disposed, for example, on the opposite side of a first imaginary plane S1 from the second through hole 60b. In the example represented in the figure, the first through hole 60a is disposed on the −Y axis direction side of the first imaginary plane S1, and the second through hole 60b is disposed on the +Y axis direction side of the first imaginary plane S1. The first imaginary plane S1 is a plane that passes through the center C of the outer container 60, and is parallel to the first surface 61. The center C is, for example, a halfway point between the surfaces 61 and 62. The center C is also a halfway point between the surfaces 63 and 64, and between the surfaces 65 and 66.

The first through hole 60a is disposed, for example, on the opposite side of a second imaginary plane (another imaginary plane) S2 from the second through hole 60b. In the example represented in the figure, the first through hole 60a is disposed on the +X axis direction side of the second imaginary plane S2, and the second through hole 60b is disposed on the −X axis direction side of the second imaginary plane S2. The second imaginary plane S2 is a plane that passes through the center C of the outer container 60, and is perpendicular to the first surface 61.

The light source unit 10, the optical system unit 20, the atom cell unit 30, the support member 40, and the flexible wiring boards 57 and 58 are disposed on the same side of the first imaginary plane S1 as the first through hole 60a. That is, the light source 12 and the atom cell are disposed on the same side of the first imaginary plane S1 as the first through hole 60a. In the example represented in the figure, the light source unit 10, the optical system unit 20, the atom cell unit 30, the support member 40, the flexible wiring boards 57 and 58, and the first through hole 60a are disposed on the −Y axis direction side of the first imaginary plane S1.

The first through hole 60a is sealed with a first sealing member 70. The second through hole 60b is sealed with a second sealing member 72. The material of the sealing members 70 and 72 is, for example, a solder.

The through holes 60a and 60b may be screw holes, and the sealing members 70 and 72 may be screws that can be threadably mated with the through holes 60a and 60b, though not shown in the drawings. Another circuit board electrically connected to the circuit board 55 may be stacked in a region of the circuit board 55 on the +Y axis direction side of the first imaginary plane S1, though not shown in the drawings.

The atom cell 31 is charged with gaseous alkali metal atoms (an alkali metal atom gas), and a buffer gas containing nitrogen ($N_2$) and argon (Ar). For example, the atom cell 31 is charged with only gaseous alkali metal atoms and a buffer gas. For example, the buffer gas contains only nitrogen and argon. The buffer gas can prevent the gaseous alkali metal atoms from colliding with one another, and can reduce the extent of stability decrease in the frequency of the atomic oscillator 100, for example.

The fraction of the partial pressure of argon with respect to the total pressure of the buffer gas is, for example, 15% to 40%, preferably 20% to 37%. In this way, desirable temperature characteristics can be obtained, for example, when the atom cell 31 is reduced in size. That is, it is possible to reduce frequency fluctuations against temperature changes.

Even though the atom cell 31 (internal space 131) is charged with a mixed gas of the buffer gas and the alkali metal atom gas, the partial pressure of the alkali metal atom gas is equal to the vapor pressure of the alkali metal atoms, and is much lower than the partial pressure of the buffer gas. Accordingly, the buffer gas can have a partial pressure close to the pressure of the mixed gas of the buffer gas and the alkali metal atom gas, that is, the pressure inside the atom cell 31.

The outer container 60 is charged with nitrogen gas ($N_2$ gas). The fraction of the partial pressure of nitrogen with respect to the pressure inside the outer container 60 (the total pressure of the mixed gas present in the outer container 60) is, for example, 99% or more, preferably 99.5% or more, more preferably 100%. Here, "100%" means that the outer container 60 contains only nitrogen gas. The pressure inside the outer container 60 is, for example, the atmospheric pressure. In this way, the outer container 60 can be prevented from collapsing under the external pressure (atmospheric pressure).

The partial pressure of the predetermined gas in the atom cell 31, or the partial pressure of the predetermined gas in the outer container 60 can be determined by, for example, destroying the atom cell 31 or the outer container 60 at a known temperature in a known atmosphere, and measuring the pressure with a quadruple mass spectrometer M-401QA-MU/G (Canon Anelva Corporation), or a high-resolution multi-turn time-of-flight mass spectrometer infiTOF-UHV (Kanomax Japan Inc.).

The first through hole 60a is a hole for supplying nitrogen gas into the outer container 60 (a nitrogen gas supply hole). The second through hole 60b is a hole for discharging atmospheric air out of the outer container 60.

Figure 6:
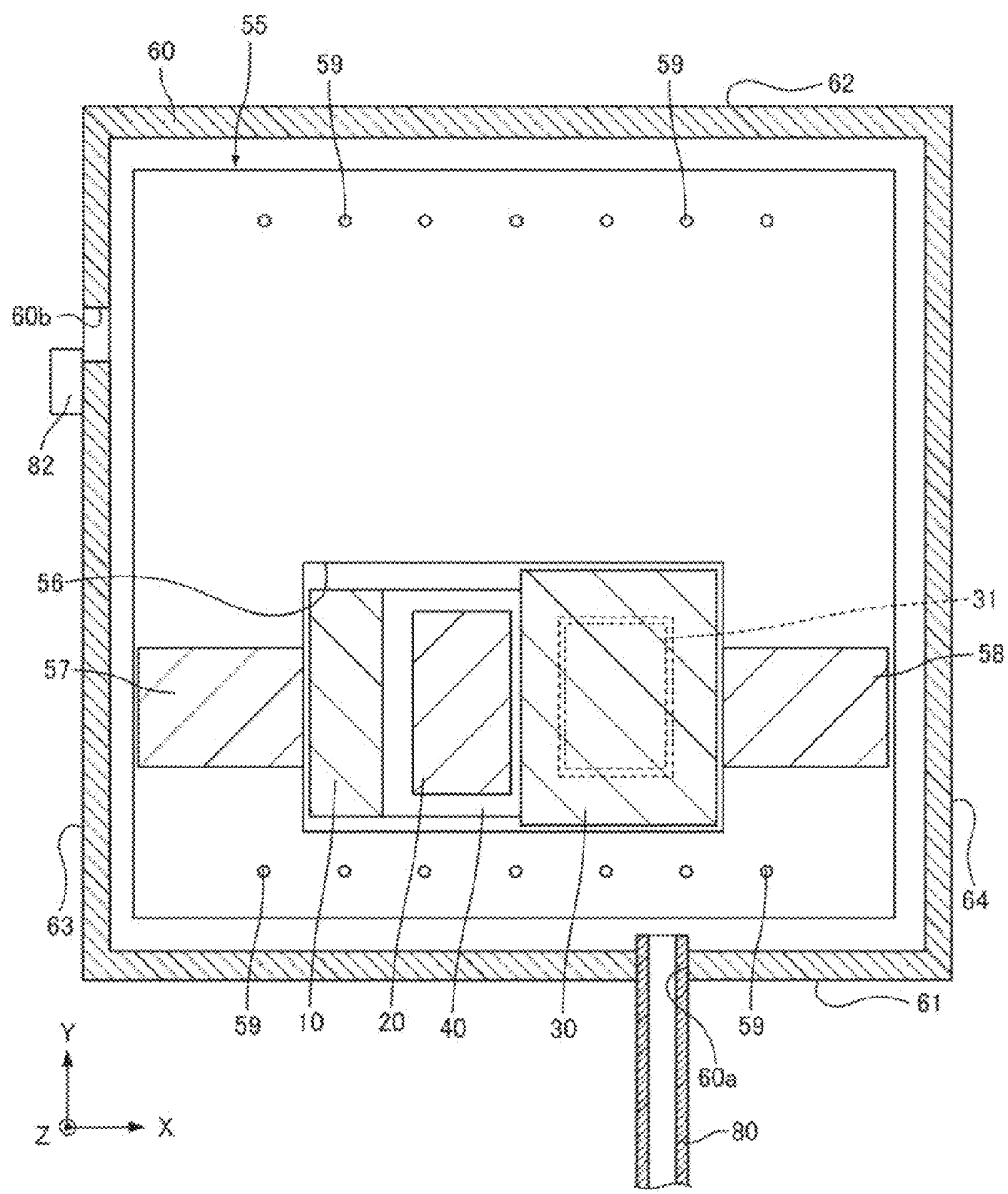
FIG. 6 is a diagram describing a method by which nitrogen gas is charged in the atomic oscillator of First Embodiment.

A method for charging nitrogen gas in the atomic oscillator 100 is described below, with reference to the accompanying drawings. FIG. 6 is a diagram describing a method by which nitrogen gas is charged in the atomic oscillator 100.

As shown in FIG. 6, with the first surface 61 facing up (a direction opposite the direction of gravitational force; −Y axis direction pointing upward in the example represented in the figure), a tube 80 is inserted in the first through hole 60a. The tube 80 is coupled to, for example, a gas cylinder (not illustrated). Nitrogen gas is then supplied into the outer container 60 through the tube 80. Because nitrogen is lighter than atmospheric air, the nitrogen gas fills the outer container 60 from the upper part of the outer container 60. In this way, the atmospheric air inside the outer container 60 can be displaced with nitrogen gas with ease. The average molar mass of atmospheric air is 28.971 g/mol. The molecular weight of nitrogen is 28.006 g/mol.

The nitrogen gas is supplied under a pressure of, for example, 0.2 MPa/m$^2$ to 0.4 MPa/m$^2$. With a nitrogen gas pressure of less than 0.2 MPa/m$^2$, it may not be possible to properly supply nitrogen gas into the outer container 60. When the nitrogen gas pressure is more than 0.4 MPa/m$^2$, the tube 80 may detach itself from the first through hole 60a. The nitrogen gas is supplied for, for example, at least 20 seconds. When the nitrogen gas supply time is less than 20 seconds, it may not be possible to properly supply nitrogen gas into the outer container 60.

For example, nitrogen gas is supplied in the presence of an oxygen concentration meter 82 disposed near the second through hole 60b. In this way, it is possible to check whether the nitrogen gas has displaced the atmospheric air inside the outer container 60. Upon the oxygen concentration meter 82 showing a predetermined value, the tube 80 is removed from the first through hole 60a, and the first through hole 60a and the second through hole 60b are sealed with the first sealing member 70 and the second sealing member 72, respectively, as shown in FIG. 4.

The atomic oscillator 100 has, for example, the following effects.

In the atomic oscillator 100, the first through hole 60a is provided in the first surface 61, and the second through hole 60b is provided in at least one of the second surface 62, the third surface 63, the fourth surface 64, the fifth surface 65, and the sixth surface 66. Accordingly, for example, when the first through hole 60a is the nitrogen gas supply hole, and the second through hole 60b is the atmospheric air discharge hole, unevenness becomes less likely to occur in the nitrogen-gas passage, and it becomes easier to displace the atmospheric air inside the outer container 60 with nitrogen gas than when the first through hole 60a and the second through hole 60b are both provided in the first surface 61. This allows the outer container of the atomic oscillator 100 to be charged with a sufficient amount of nitrogen gas, for example. In this way, species of small molecular weights, for example, such as helium, are less likely to enter the atom cell 31 through the atom cell 31 in the atomic oscillator 100. Accordingly, the atomic oscillator 100 involves fewer frequency fluctuations (specifically, the ground-level, hyperfine splitting frequency of the alkali metal atom is less likely to fluctuate), and the frequency remains stable for extended time periods.

In the atomic oscillator 100, the outer container is charged with nitrogen gas, and hydrolytic deterioration of the adhesive due to moisture in the atmospheric air can be reduced. The adhesive is used to, for example, fix the support member 40 to the base 67.

In the atomic oscillator 100, the first through hole 60a is the nitrogen gas supply hole, and the light source 12 and the atom cell 31 are disposed on the same side of the first imaginary plane S1 as the first through hole 60a. Accordingly, in the atomic oscillator 100, the nitrogen gas more easily diffuses by hitting the light source 12 and the atom cell 31 when being supplied into the outer container 60 than when the light source 12 and the atom cell 31 are disposed on a different side of the first imaginary plane S1 from the first through hole 60a. This makes it easier to displace the atmospheric air inside the outer container 60 with nitrogen gas when charging the outer container 60 with nitrogen gas in the atomic oscillator 100.

In the atomic oscillator 100, the first through hole 60a is disposed on the opposite side of the first imaginary plane S1 from the second through hole 60b. Accordingly, in the atomic oscillator 100, nitrogen gas can more easily be supplied to the opposite side of the first imaginary plane S1 from the first through hole 60a than when, for example, the first through hole 60a and the second through hole 60b are disposed on the same side of the first imaginary plane S1.

In the atomic oscillator 100, the first through hole 60a is disposed on the opposite side of the second imaginary plane S2 from the second through hole 60b. Accordingly, in the atomic oscillator 100, the amount of nitrogen that discharges through the second through hole 60b can be reduced as compared to when, for example, the first through hole 60a and the second through hole 60b are disposed on the same side of the second imaginary plane S2 along the normal line of the first surface 61 (not illustrated).

In the atomic oscillator 100, the second through hole 60b is provided in the third surface 63. Accordingly, in the atomic oscillator 100, the nitrogen gas more easily diffuses by hitting the wall forming the second surface 62 of the outer container 60 when being supplied into the outer container 60 than when, for example, the second through hole 60b is provided in the second surface 62. This makes it easier to displace the atmospheric air inside the outer container 60 with nitrogen gas when charging the outer container 60 with nitrogen gas in the atomic oscillator 100.

1.2. Variations of Atomic Oscillator 1.2.1. First Variation

Figure 7:
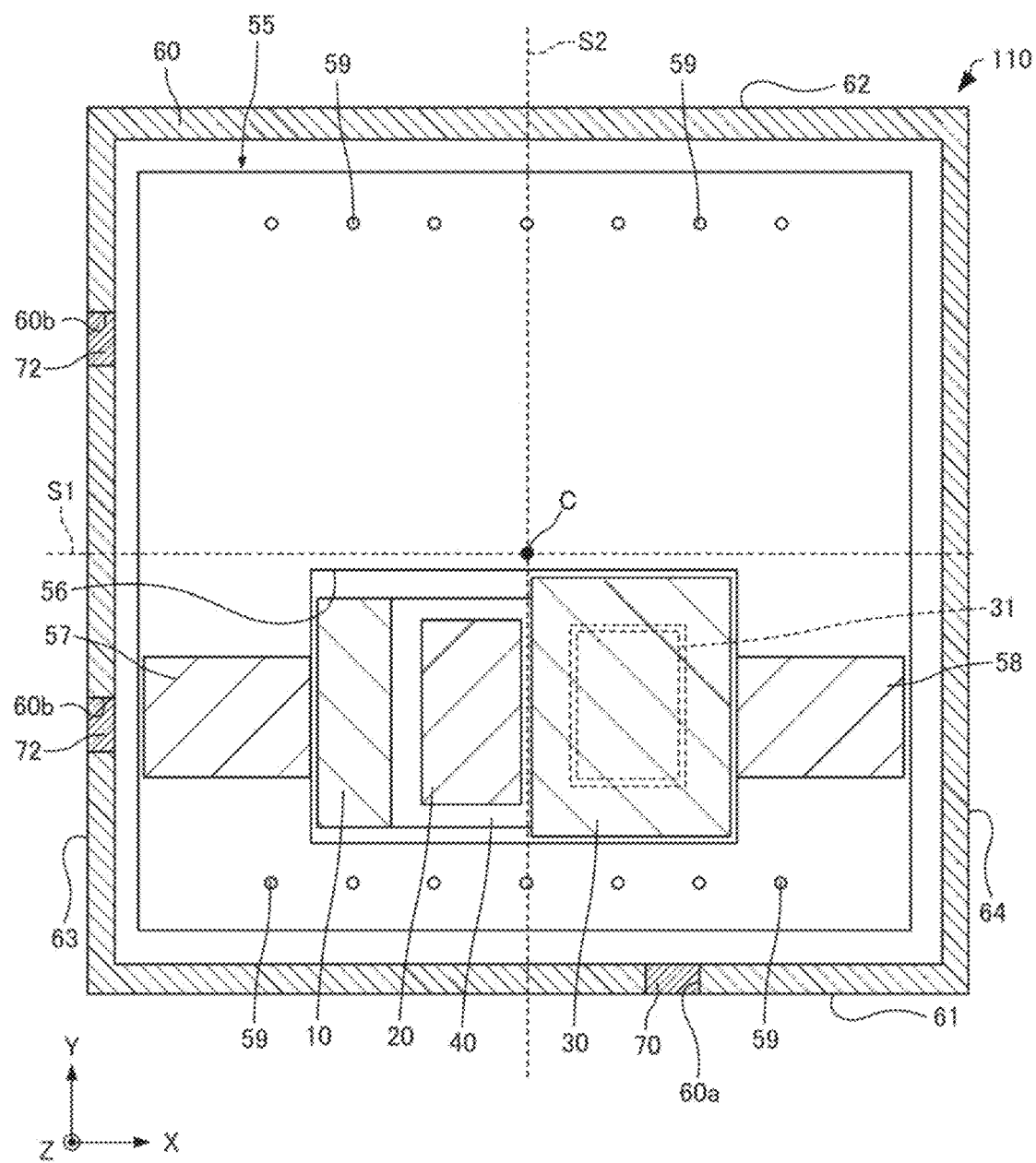
FIG. 7 is a cross sectional view schematically representing an atomic oscillator according to a first variation of First Embodiment.

An atomic oscillator according to a first variation of First Embodiment is described below, with reference to the accompanying drawings. FIG. 7 is a cross sectional view schematically representing an atomic oscillator 110 according to a first variation of First Embodiment.

As a matter of convenience, FIG. 7 (and FIG. 8 described later) shows the light source unit 10, the optical system unit 20, the atom cell unit 30, and the support member 40 in a simplified fashion.

The following descriptions of the atomic oscillator 110 according to a first variation of First Embodiment deal with only differences from the atomic oscillator 100 described in the foregoing exemplary embodiment, and the same features will not be described. The same is the case for an atomic oscillator according to a second variation of First Embodiment.

In the atomic oscillator 100 described above, the second through hole 60b is a single through hole, as illustrated in FIG. 4. In the atomic oscillator 110, however, two second through holes 60b are provided, as illustrated in FIG. 7.

In the example represented in FIG. 7, one of the second through holes 60b is disposed on the same side of the first imaginary plane S1 as the first through hole 60a (−Y axis direction side). The other second through hole 60b is disposed on the opposite side of the first imaginary plane S1 from the first through hole 60a (+Y axis direction side).

In the atomic oscillator 110, the atmospheric air inside the outer container 60 can more easily be displaced with nitrogen gas than when the through holes 60a and 60b are provided in the first surface 61. However, considering the labor required to seal the two second through holes 60b, the atomic oscillator 100 is more desirable.

1.2.2. Second Variation

Figure 8:
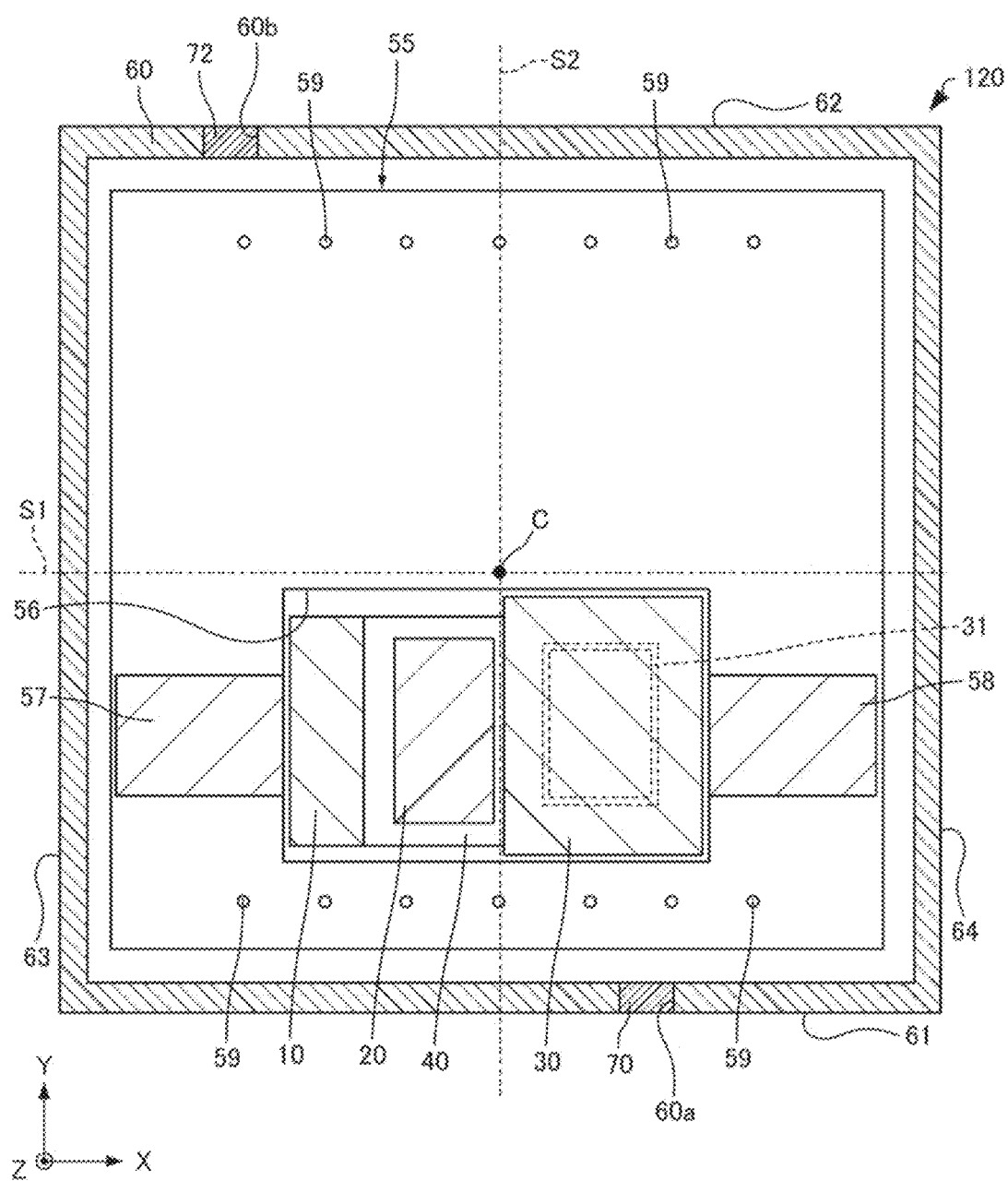
FIG. 8 is a cross sectional view schematically representing an atomic oscillator according to a second variation of First Embodiment.

An atomic oscillator according to a second variation of First Embodiment is described below, with reference to the accompanying drawings. FIG. 8 is a cross sectional view schematically representing an atomic oscillator 120 according to a second variation of First Embodiment.

In the atomic oscillator 100 described above, the second through hole 60b is provided in the third surface 63, as illustrated in FIG. 4. In the atomic oscillator 120, however, the second through hole 60b is provided in the second surface 62, as illustrated in FIG. 8.

In the atomic oscillator 120, the atmospheric air inside the outer container 60 can more easily be displaced with nitrogen gas than when the through holes 60a and 60b are provided in the first surface 61. However, in the atomic oscillator 100, the nitrogen gas more easily diffuses by hitting the wall forming the second surface 62 of the outer container 60 when being supplied into the outer container 60.

The second through hole 60b may be provided in the fourth surface 64, or in the fifth surface 65 or the sixth surface 66, though not shown in the drawings. It is also possible to provide the second through hole 60b in more than one surface, for example, in the third surface 63 and the fourth surface 64, provided that the second through hole 60b is not provided in the first surface 61.

2. Second Embodiment

An atomic oscillator according to Second Embodiment is described below. The atomic oscillator according to Second Embodiment will be described with regard to only differences from the atomic oscillator 100 described in the foregoing embodiment, and the same features will not be described.

In the atomic oscillator 100 described above, the outer container 60 is charged with nitrogen gas. However, in the atomic oscillator according to Second Embodiment, the outer container 60 is charged with argon gas (Ar gas). The fraction of the partial pressure of argon with respect to the pressure inside the outer container 60 is, for example, 99% or more, preferably 99.5% or more, more preferably 100%. In the atomic oscillator according to Second Embodiment, the first through hole 60a is a hole for supplying argon gas into the outer container 60 (argon gas supply hole).

In the atomic oscillator according to Second Embodiment, argon gas is charged into the outer container 60 in the manner described below. With the first surface facing down (the direction of gravitational force; −Y axis direction pointing downward in the example represented in the figure), argon gas is supplied into the outer container 60 through the first through hole 60*a*. Because argon is heavier than atmospheric air, the argon gas fills the outer container 60 from the bottom part of the outer container 60. In this way, the atmospheric air inside the outer container 60 can be displaced with argon gas with ease. The molecular weight of argon is 39.962 g/mol.

Aside from this, the same method used to contain nitrogen gas described above for the atomic oscillator 100 can be used to contain argon gas in the atomic oscillator according to Second Embodiment.

By adapting the same configuration as that of the atomic oscillator 100, the atomic oscillator according to Second Embodiment can have the same advantages as the atomic oscillator 100, and the atmospheric air inside the outer container 60 can be displaced with argon gas with ease.

As in the atomic oscillator 110 described above, two second through holes 60*b* may be provided in the atomic oscillator according to Second Embodiment. As in the atomic oscillator 120 described above, the second through hole 60*b* may be provided in the second surface 62 in the atomic oscillator according to Second Embodiment.

3. Third Embodiment

Figure 9:
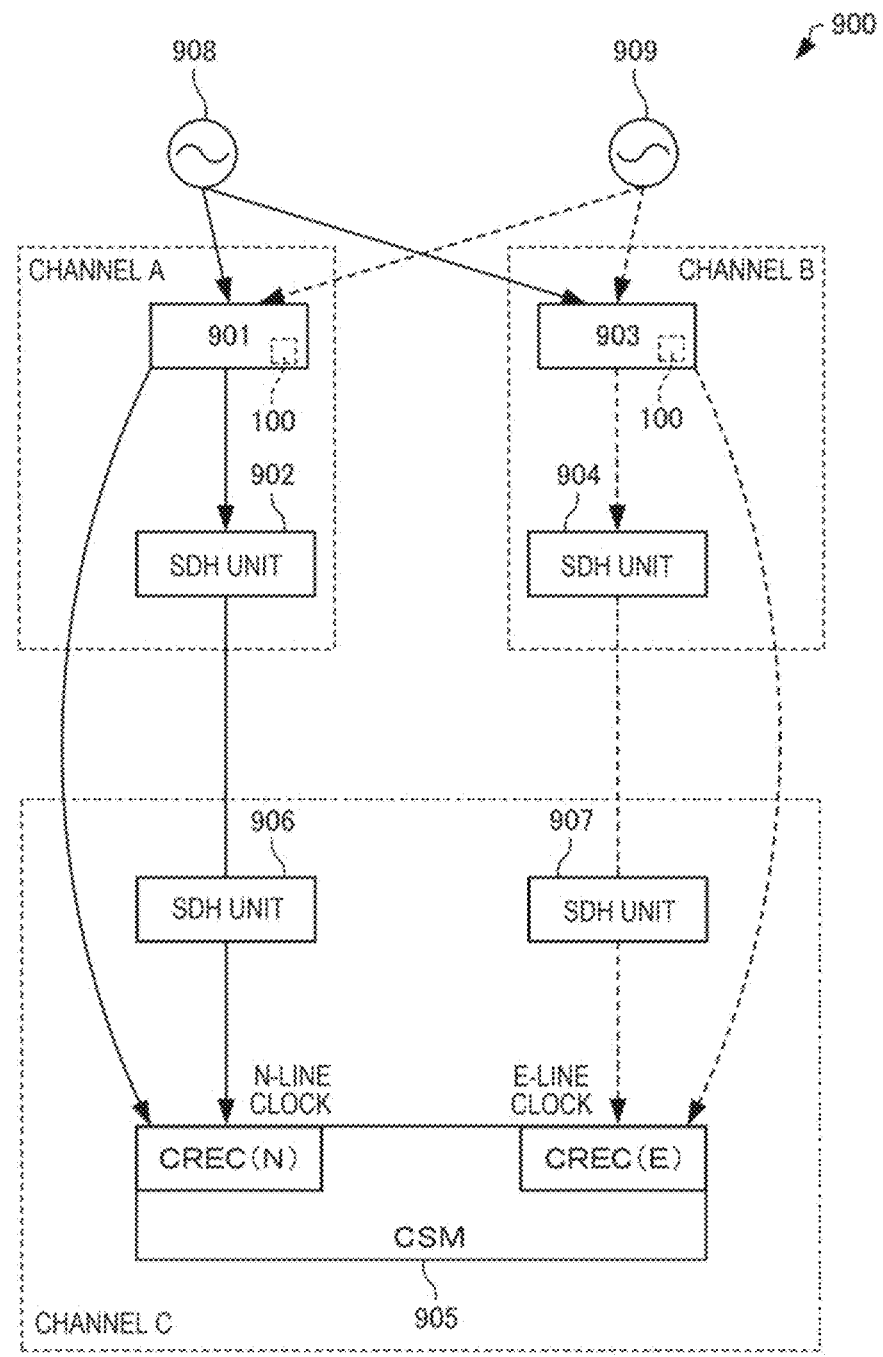
FIG. 9 is a block diagram schematically representing a frequency signal generation system according to Third Embodiment.

A frequency signal generation system according to Third Embodiment is described below, with reference to the accompanying drawings. The clock transfer system (timing server) described below is an example of the frequency signal generation system. FIG. 9 is a block diagram schematically representing a clock transfer system 900.

A clock transfer system according to the embodiment of the invention includes the atomic oscillator of any of the embodiments of the invention. As an example, the clock transfer system 900 will be described as being provided with the atomic oscillator 100.

The clock transfer system 900 is a time-division multiplex system for matching the clocks of different devices or units in a network, and has a redundant configuration that includes an N (Normal) line and an E (Emergency) line.

As shown in FIG. 9, the clock transfer system 900 includes a clock supply unit 901 and an SDH (Synchronous Digital Hierarchy) unit 902 in channel A (upper channel, N line), a clock supply unit 903 and an SDH unit 904 in channel B (upper channel, E line), and a clock supply unit 905 and SDH units 906 and 907 in channel C (lower channel). The clock supply unit 901 includes the atomic oscillator 100, and generates an N-line clock signal. The atomic oscillator 100 in the clock supply unit 901 generates a clock signal in synchronism with a high-accuracy clock signal from master clocks 908 and 909 that include an atomic oscillator using cesium.

The SDH unit 902 sends and receives a main signal according to the clock signal from the clock supply unit 901, and transfers the main signal to the clock supply unit 905 of the lower channel after superimposing the N-line clock signal on the main signal. The clock supply unit 903 includes the atomic oscillator 100, and generates an E-line clock signal. The atomic oscillator 100 in the clock supply unit 903 generates a clock signal in synchronism with a high-accuracy clock signal from the master clocks 908 and 909 that include an atomic oscillator using cesium.

The SDH unit 904 sends and receives a main signal according to the clock signal from the clock supply unit 903, and transfers the main signal to the clock supply unit 905 of the lower channel after superimposing the E-line clock signal on the main signal. The clock supply unit 905 receives the clock signal from the clock supply units 901 and 903, and generates a clock signal in synchronism with the received clock signal.

The clock supply unit 905 normally generates a clock signal in synchronism with the N-line clock signal from the clock supply unit 901. When an error occurs in the N line, the clock supply unit 905 generates a clock signal in synchronism with the E-line clock signal from the clock supply unit 903. By switching N line to E line, a stable supply of clock signal is ensured, and the reliability of the clock path network can improve. The SDH unit 906 sends and receives a main signal according to the clock signal from the clock supply unit 905. Similarly, the SDH unit 907 sends and receives a main signal according to the clock signal from the clock supply unit 905. In this way, the units in channel C can synchronize with the units of channel A or B.

The frequency signal generation system according to the present embodiment is not limited to the clock transfer system. The frequency signal generation system is inclusive of systems configured from a plurality of devices including various types of devices or units that include the atomic oscillator, and use a frequency signal of the atomic oscillator.

Examples of the frequency signal generation system according to the present embodiment include smartphones, tablets, time pieces, mobile phones, digital still cameras, liquid ejection apparatuses (for example, inkjet printers), personal computers, televisions, video cameras, video cassette recorders, car navigations, pagers, electronic organizers, electronic dictionaries, calculators, electronic gaming machines, word processors, workstations, video phones, security television monitors, electronic binoculars, POS (point of sales) terminals, medical equipment (including, for example, electronic thermometers, blood pressure meters, blood glucose meters, electrocardiogram machines, ultrasonic diagnostic apparatuses, electronic endoscopes, and magnetocardiography devices), fish sonars, GNSS (Global Navigation Satellite System) frequency standards, various measurement devices, instruments (including, for example, instruments for automobiles, aircraft, and ships), flight simulators, terrestrial digital broadcasting systems, base stations for cell phones, and vehicles (e.g., automobiles, aircraft, and ships).

4. Experiment Examples

The invention is described below in greater detail using Experiment Examples. It is to be noted, however, that the invention is in no way limited by the following Experiment Examples.

4.1. First Experiment Example 4.1.1. Time-Dependent Partial Pressure Changes in Atom Cell The following simulation was carried out using a model of the atom cell and the outer container described above with reference to FIGS. 2 to 5.

First, time-dependent changes in partial pressure $P_{in}(t)$ in the atom cell were calculated. $P_{in}(t)$ was derived using the following formula (1).

$$P_{in}(t) = P_{ext} - [P_{ext} - P_{in}(t=0)]e^{-\frac{L}{VP_{ref}}t} \quad (1)$$

In the formula (1), $P_{in}(t=0)$ is the initial pressure value [Torr] in the atom cell. $P_{ext}$ is the initial pressure value in the outer container (the pressure outside of the atom cell) [Torr]. L is the gas permeation rate [Torr·L/s] against the atom cell. V is the volume [L] inside the atom cell. $P_{ref}$ is the atmospheric pressure [Torr]. Note that $P_{in}(t=0)$, $P_{ext}$, and L are values for molecules of interest for partial pressure calculations.

Specifically, assuming that the atom cell is charged with only nitrogen gas and argon gas, the variables had the following values. The initial value of the partial pressure of nitrogen in the atom cell is 72.5 Torr, and the initial value of the partial pressure of argon in the atom cell is 27.5 Torr. The permeation rate is $5.12\times10^{-16}$ (5.12E-16) Torr·L/s for nitrogen, and $5.12\times10^{-16}$ Torr·L/s for argon. The volume inside the atom cell is 111.33 µL. The atmospheric pressure is 760 Torr.

Assuming that the outer container is charged with only nitrogen gas, the nitrogen pressure in the outer container was measured to be 760 Torr.

Figure 10:
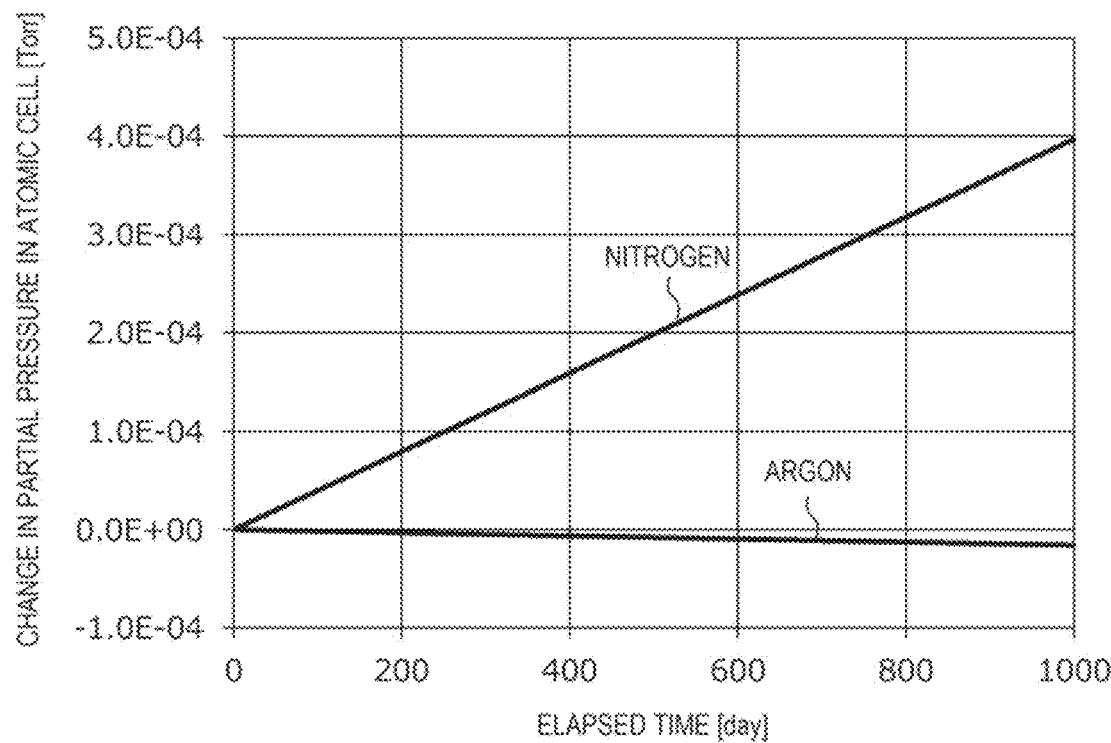
FIG. 10 is a graph representing time-dependent changes in the partial pressure of the gas components in the atom cell.

FIG. 10 is a graph representing time-dependent changes in the partial pressure of nitrogen and argon in the atom cell when the outer container is charged with nitrogen gas.

In FIG. 10, the vertical axis represents partial pressure changes in the atom cell. The initial value is zero. In FIG. 10, positive values on vertical axis mean increasing partial pressures in the atom cell, and negative values on vertical axis mean decreasing partial pressures in the atom cell. The same is the case for FIG. 11 described below.

As shown in FIG. 10, the partial pressure of nitrogen in the atom cell increased with time. This is because of the time-dependent influx of nitrogen gas into the atom cell from outside of the atom cell. In contrast, the partial pressure of argon in the atom cell decreased with time. This is a result of the efflux of the argon gas from inside to outside of the atom cell over time. From FIG. 10, a change y in the partial pressure of nitrogen in the atom cell against elapsed time x can be approximated by the following formula (2). A change y in the partial pressure of argon in the atom cell against elapsed time x can be approximated by the following formula (3).

$$y=3.97\times10^{-7}x+1.54\times10^{-12} \quad (2)$$

$$y=-1.59\times10^{-8}x-6.13\times10^{-14} \quad (3)$$

Time-dependent changes in partial pressure $P_{in}(t)$ in the atom cell were calculated for an outer container containing atmospheric air. The gases in the outer container had the following set pressures.
Nitrogen: 593.4384 Torr
Argon: 7.0984 Torr
Oxygen: 159.1972 Torr
Neon: 0.0138 Torr
Helium: 0.0040 Torr
Hydrogen: 0.0004 Torr The permeation rate is $5.12\times10^{-9}$ Torr·L/s for helium, and $1.02\times10^{-10}$ Torr·L/s for neon.

Figure 11:
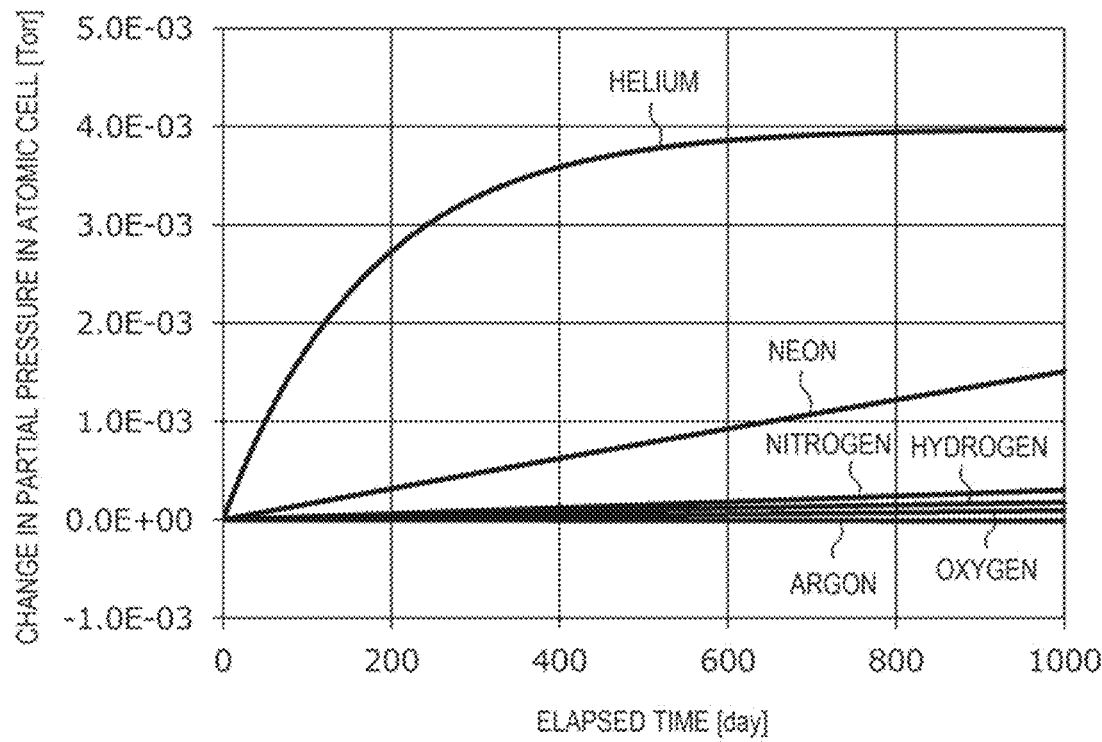
FIG. 11 is a graph representing time-dependent changes in the partial pressure of the gas components in the atom cell.

FIG. 11 is a graph representing time-dependent changes in partial pressure in the atom cell for the outer container containing atmospheric air.

As shown in FIG. 11, partial pressure changes are larger for helium and neon, and, helium, in particular, had a tendency to more easily enter the atom cell. For elements other than helium and neon, partial pressure changes were smaller for nitrogen, hydrogen, oxygen, and argon, in this order.

4.1.2. Time-Dependent Changes of Frequency Deviation

The frequency of the atomic oscillator at time t ($\Delta v(t)$) was calculated for an outer container charged with only nitrogen gas, and for an outer container charged with only argon gas. $\Delta v(t)$ was calculated using the following formula (4).

$$\Delta v(t)=P_0[\beta+\delta(T-T_0)+\gamma(T-T_0)^2] \quad (4)$$

In the formula (4), $P_0$ represents the pressure [Torr] inside the atom cell at temperature $T_0$, and $\Delta v(t)$ at each time point was calculated by substituting the partial pressure $P_{in}(t)$ of formula (1) in $P_0$. $T_0$ represents the reference temperature, which is 25° C. T represents the atom cell temperature, and is 65° C. $\beta$, $\delta$, and $\gamma$ represent the pressure coefficient or temperature coefficient against cesium, and were set as shown in Table 1 below. The partial pressure of nitrogen in the atom cell had an initial value of 72.5 Torr (a value at time 0), and the partial pressure of argon in the atom cell had an initial value of 27.5 Torr. Aside from the coefficients for nitrogen and argon, Table 1 also shows $\beta$, $\delta$, and $\gamma$ for neon, and $\beta$ and $\delta$ for helium and hydrogen.

TABLE 1

| | Pressure coefficient β [Hz/Torr] | Primary temperature coefficient δ [Hz/(Torr · ° C.)] | Secondary temperature coefficient γ [mHz/(Torr · ° C.²)] |
|---|---|---|---|
| Nitrogen | 922.5 | 0.824 | -2.51 |
| Argon | -194.4 | -1.138 | 0.0 |
| Neon | 686 | 0.266 | -1.68 |
| Helium | 1103.1 | 1.43 | — |
| Hydrogen | 1900.1 | 0 | — |

Frequency deviation fdev at each time point was calculated using the following formula (5).

$$fdev=(\Delta v(t)-\Delta v(0))/vhfs \quad (5)$$

In the formula (5), $\Delta v(0)$ represents the frequency at time 0 derived from formula (4). $\Delta v(t)$ represents the frequency at time t derived from formula (4). vhfs represents the hyperfine splitting frequency [Hz] at ground level, and is 9.192 GHz for cesium.

Figure 12:
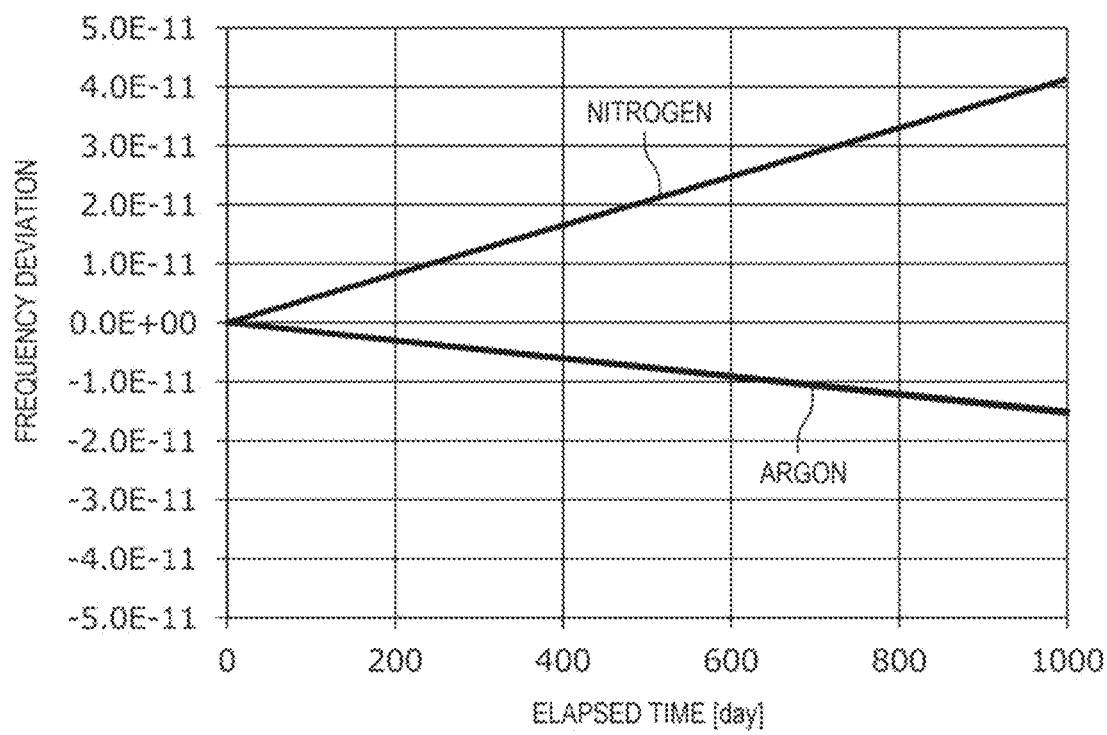
FIG. 12 is a graph representing frequency deviation against time.

FIG. 12 is a graph representing frequency deviation fdev against elapsed time for an outer container charged with only nitrogen gas or argon gas. The pressure inside the outer container was 760 Torr.

In FIG. 12, the vertical axis represents frequency deviation fdev. The initial value is zero. In FIG. 12, the frequency of the atomic oscillator is higher for positive values of frequency deviation fdev on vertical axis, and is lower for negative values of frequency deviation fdev on vertical axis. The same is the case for FIG. 13.

As shown in FIG. 12, in the outer container charged with nitrogen gas, the frequency increased with time, whereas the frequency decreased with time in the outer container containing argon gas. From FIG. 12, a frequency deviation y against elapsed time x for the outer container charged with nitrogen gas can be approximated by the formula (6) below. For the outer container charged with argon gas, a frequency deviation y against elapsed time x can be approximated by the formula (7) below.

$$y=4.15\times10^{-14}x+1.61\times10^{-19} \quad (6)$$

$$y=-1.54\times10^{-14}x-5.85\times10^{-20} \quad (7)$$

Figure 13:
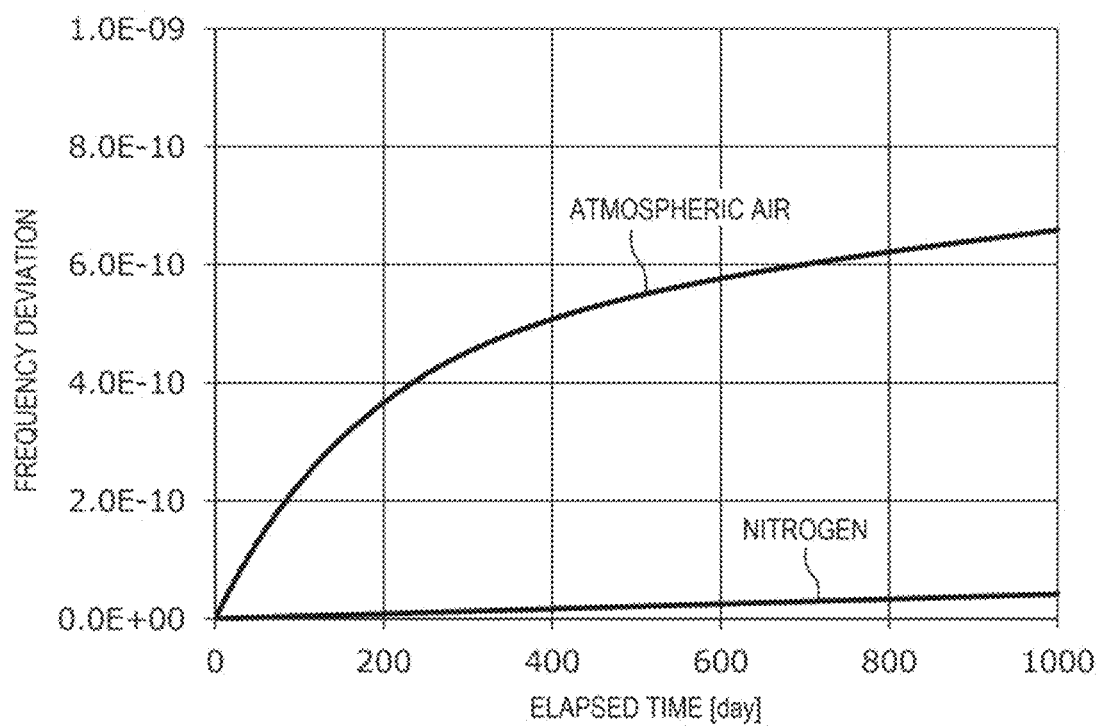
FIG. 13 is a graph representing frequency deviation against time.

Frequency deviation fdev against elapsed time was also calculated for an outer container containing atmospheric air. FIG. 13 is a graph representing frequency deviation fdev against elapsed time for an outer container containing atmospheric air. The partial pressure of nitrogen in the atom cell had an initial value of 72.5 Torr, and the partial pressure of argon in the atom cell had an initial value of 27.5 Torr. For comparison, FIG. 13 also shows frequency deviation fdev against elapsed time for an outer container charged with only nitrogen gas.

As shown in FIG. 13, the frequency deviation fdev was larger for the outer container containing atmospheric air than for the outer container charged with nitrogen gas. In FIG. 13, the point of inflection on the curve for the outer container containing atmospheric air corresponds to that on the curve for helium shown in FIG. 11. This result showed that changes in frequency deviation fdev for the outer container containing atmospheric air were highly influenced by helium.

Table 2 shows changes in frequency deviation fdev per day in the outer container charged with only nitrogen gas, the outer container charged with only argon gas, and the outer container containing atmospheric air. The values presented in Table 2 are based on FIG. 12 and FIG. 13.

For atmospheric air, calculations were made for only gases that do not chemically react with cesium but function as buffer gas. For example, the calculation did not take into account oxygen because oxygen is reactive to cesium. Carbon dioxide was also excluded from calculations because this molecule has a larger molecular diameter than oxygen, and probably does not pass through the atom cell as easily as even oxygen.

The frequency $\Delta v(t)$ for atmospheric air was calculated using the following formula (8).

$$\Delta v(t) = P_{N2}[\beta_{N2} + \delta_{N2}(T - T_0) + \gamma_{N2}(T - T_0)^2] + \qquad (8)$$
$$P_{Ar}[\beta_{Ar} + \delta_{Ar}(T - T_0) + \gamma_{Ar}(T - T_0)^2] +$$
$$P_{Ne}[\beta_{Ne} + \delta_{Ne}(T - T_0) + \gamma_{Ne}(T - T_0)^2] +$$
$$P_{He}[\beta_{He} + \delta_{He}(T - T_0) + \gamma_{He}(T - T_0)^2] +$$
$$P_{H2}[\beta_{H2} + \delta_{H2}(T - T_0) + \gamma_{H2}(T - T_0)^2]$$

In the formula (8), $P_{N2}$ represents the partial pressure [Torr] of nitrogen in the atom cell at temperature $T_0$. $P_{Ar}$ represents the partial pressure [Torr] of argon in the atom cell at temperature $T_0$. $P_{Ne}$ represents the partial pressure [Torr] of neon in the atom cell at temperature $T_0$. $P_{He}$ represents the partial pressure [Torr] of helium in the atom cell at temperature $T_0$. $P_{H2}$ represents the partial pressure [Torr] of hydrogen in the atom cell at temperature $T_0$. $\beta_{N2}$, $\delta_{N2}$, and $\gamma_{N2}$ represent the pressure coefficient or temperature coefficient of nitrogen against cesium. $\beta_{Ar}$, $\delta_{Ar}$, and $\gamma_{Ar}$ represent the pressure coefficient or temperature coefficient of argon against cesium. $\beta Ne$, $\delta_{Ne}$, and $\gamma_{Ne}$ represent the pressure coefficient or temperature coefficient of neon against cesium. $\beta_{He}$ and $\delta_{He}$ represent the pressure coefficient or temperature coefficient of helium against cesium. $\beta_{H2}$ and $\delta_{H2}$ represent the pressure coefficient or temperature coefficient of hydrogen against cesium. $\beta$, $\delta$, and $\gamma$ of each gas were set as shown in Table 1.

The partial pressures of nitrogen, argon, neon, helium, and hydrogen in the atmospheric outer container had initial values of 593.4384 Torr, 7.0984 Torr, 0.0138 Torr, 0.0040 Torr, and 0.0004 Torr, respectively.

TABLE 2

| | Frequency deviation change [/day] | |
|---|---|---|
| | Day 0 to 100 | Day 600 to 1,000 |
| Nitrogen | $4.15 \times 10^{-14}$ | $4.15 \times 10^{-14}$ |
| Argon | $-1.54 \times 10^{-14}$ | $-1.54 \times 10^{-14}$ |
| Atmospheric air | $2.39 \times 10^{-12}$ | $2.04 \times 10^{-13}$ |

As can be seen from Table 2, by containing nitrogen gas or argon in the outer container, changes in frequency deviation fdev can be made smaller than when the atmosphere inside of the outer container is atmospheric air. It was also found that, by containing argon in the outer container, the frequency change can be reduced to about ⅓ of that in the outer container charged with nitrogen. A possible standard value of frequency deviation change per day ($\Delta$fdev/day) is $1.66 \times 10^{-12}$ or less.

4.1.3. Frequency Deviation Change Against Displacement Rate of Nitrogen Gas

Changes in frequency deviation fdev per day with varying displacement rates of nitrogen gas in the outer container were calculated from day 0 to day 100. The displacement rate of nitrogen gas is the ratio of the partial pressure of nitrogen with respect to the pressure inside the outer container. The atmosphere inside the outer container is atmospheric air when the displacement rate is 0%, and is a nitrogen atmosphere when the displacement rate is 100%. The partial pressure of nitrogen in the atom cell had an initial value of 72.5 Torr, and the partial pressure of argon in the atom cell had an initial value of 27.5 Torr.

Figure 14:
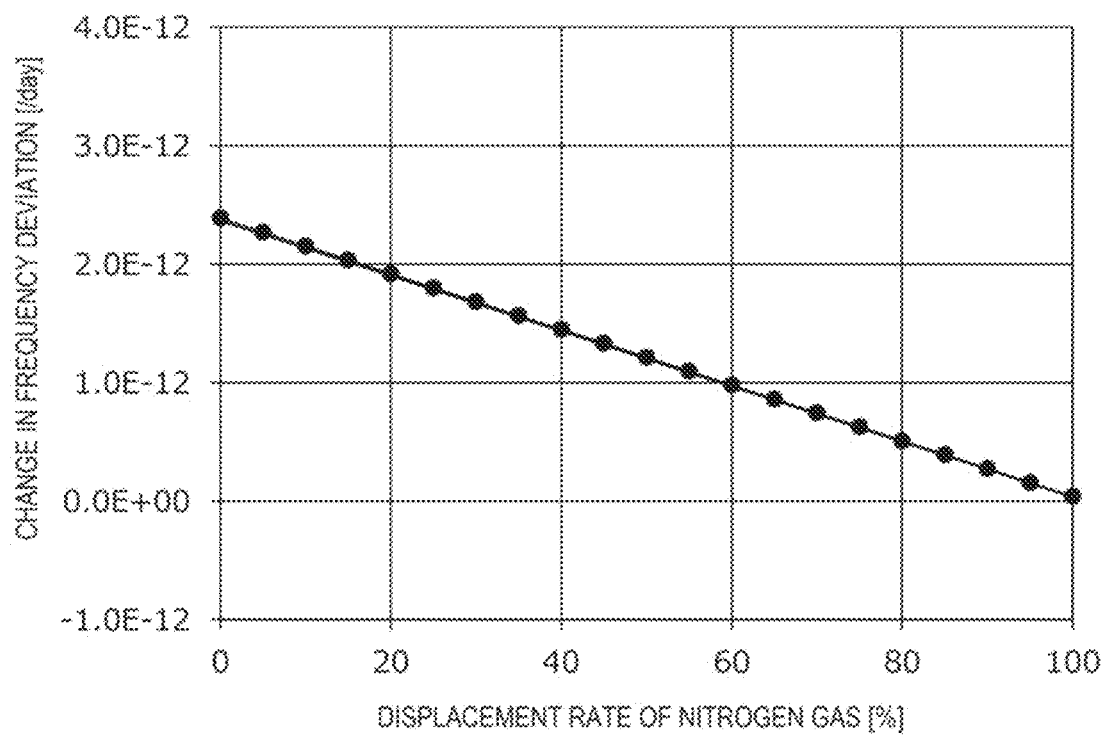
FIG. 14 is a graph representing changes in frequency deviation against the displacement rate of nitrogen gas.

FIG. 14 is a graph representing changes in frequency deviation fdev against the displacement rate of nitrogen gas. As can be seen from FIG. 14, changes in frequency deviation fdev decrease with increase in the displacement rate of nitrogen gas. From FIG. 14, a change y in frequency deviation fdev against displacement rate x of nitrogen gas can be approximated by the following formula (9).

$$y = -2.35 \times 10^{-14} x + 2.39 \times 10^{-12} \qquad (9)$$

Though not shown in the graph, the frequency deviation fdev will probably show the same pattern of change ($\Delta$fdev/day) with varying displacement rates of argon gas in the outer container as that observed for nitrogen gas. That is, it can be said that changes in frequency deviation fdev can be made smaller with increasing displacement rates of argon gas.

4.2. Second Experiment Example

A simulation was carried out with regard to the passage of nitrogen gas supplied into the outer container. Specifically, simulations were carried out using the finite element method, using the model M1 shown in FIG. 15, and the model M2 shown in FIG. 16.

Figure 15:
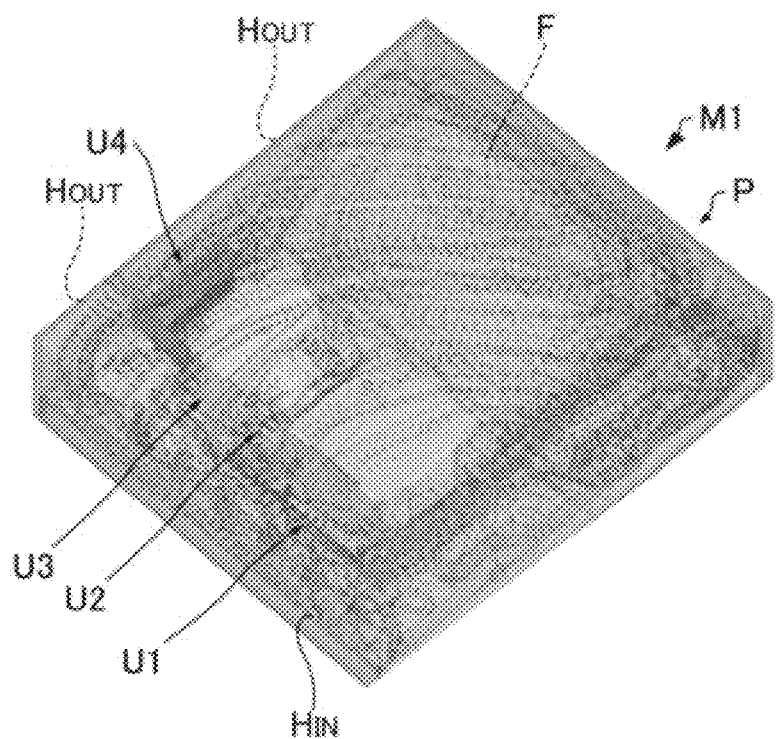
FIG. 15 is a diagram describing a model used in Experiment Example.
Figure 16:
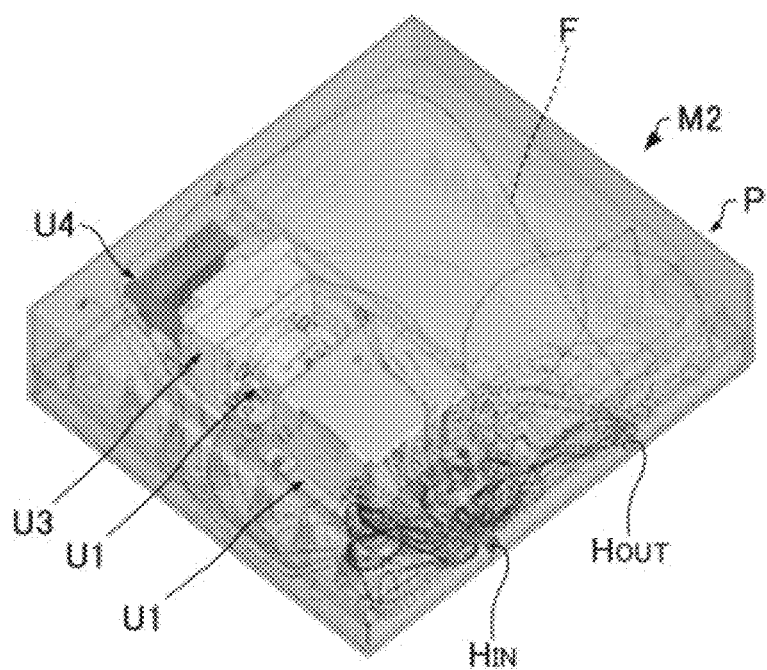
FIG. 16 is a diagram describing a model used in Experiment Example.

FIGS. 15 and 16 show transparent views of outer containers P. As illustrated in FIGS. 15 and 16, model M1 and model M2 include a light source unit U1, an optical system unit U2, an atom cell unit U3, and a control unit U4. As illustrated in FIG. 15, in model M1, the first through hole HIN for supplying nitrogen gas, and the second through hole HOUT for discharging atmospheric air are provided in different surfaces of the outer container P. In model M1, two second through holes HOUT are provided. In model M2, as illustrated in FIG. 16, the first through hole HIN for supplying nitrogen gas, and the second through hole HOUT for discharging atmospheric air are provided in the same surface of the outer container P.

These models M1 and M2 were used to simulate supply of nitrogen gas into the outer container P. In FIGS. 15 and 16, a passage F of nitrogen gas is shown in broken lines.

As shown in FIGS. 15 and 16, in model M1, the nitrogen gas passage F was observed throughout inside of the outer container P, whereas the nitrogen gas passage F unevenly occurred in model M2. It was found from this result that the nitrogen gas passage F becomes more even, and the atmospheric air inside the outer container P can be more easily displaced with nitrogen gas when the through holes HIN and HOUT are provided in different surfaces of the outer container P than in the same surface of the outer container P.

The result observed for nitrogen gas in FIGS. 15 and 16 will probably be the same for argon gas.

4.3. Third Experiment Example

The atomic oscillator shown in FIG. 15 was actually produced, and the displacement rate of nitrogen gas was measured.

With the surface provided with the first through hole (a nitrogen gas supply hole) facing upward (a direction opposite the direction of gravitational force), nitrogen gas was supplied into the outer container through the first through hole. The nitrogen gas was supplied under a pressure of 0.3 $MPa/m^2$ for at least 30 seconds. After 20 seconds from the start of supply of nitrogen gas, the oxygen concentration meter disposed near the second through hole through which the atmospheric air discharges had a reading of 100 ppm (volume %) or less, showing that inside of the outer container was solely nitrogen gas. A low-concentration zirconia oxygen concentration meter OX400 (Yokogawa Electric Corporation) was used as the oxygen concentration meter.

The experiment revealed that only nitrogen gas can be contained in the outer container when the first through hole, which is a nitrogen gas supply hole, and the second through hole, through which the atmospheric air discharges, are provided in different surfaces of the outer container.

The result observed for nitrogen gas will probably be the same for argon gas, provided that argon gas is supplied through the first through hole with the surface provided with the first through hole facing downward.

The configurations described in the embodiments of the invention described above may be partially omitted, and the embodiments or variations described above may be combined, provided that the features and effects described in this specification are not lost after such omissions and modifications.

The invention encompasses configurations substantially the same as the configurations described in the embodiments (for example, configurations sharing the same functions, methods, and results, or configurations sharing the same objects and effects). The invention also encompasses configurations that differ from the configurations of the foregoing embodiments in non-substantive parts. The invention also encompasses configurations having the same advantages as the configurations of the foregoing embodiments, or configurations that can achieve the same object as the configurations of the foregoing embodiments. The invention also encompasses configurations that use known techniques with the configurations of the foregoing embodiments.

What is claimed is:

1. An atomic oscillator comprising:
a light source;
an atom cell containing a gaseous alkali metal atom, and a nitrogen- and argon-containing buffer gas, and through which light from the light source passes;
a photodetector that detects light having passed through the atom cell; and
a container containing nitrogen gas and housing the atom cell, the container having a first surface, a second surface, a third surface, a fourth surface, a fifth surface, and a sixth surface,
the first surface has a first through hole,
at least one of the second surface, the third surface, the fourth surface, the fifth surface, and the sixth surface has a second through hole.

2. The atomic oscillator according to claim 1, wherein:
the first through hole is a hole for supplying the nitrogen gas,
the light source and the atom cell are disposed on the same side of a first imaginary plane as the first through hole, and
the first imaginary plane is a plane that passes through a center of the container, and is parallel to the first surface.

3. The atomic oscillator according to claim 2, wherein the second through hole is positioned on the opposite side of the first imaginary plane from the first through hole.

4. The atomic oscillator according to claim 3, wherein:
the second through hole is positioned on the opposite side of a second imaginary plane from the first through hole, and
the second imaginary plane is a plane that passes through the center of the container, and is perpendicular to the first surface.

5. The atomic oscillator according to claim 4, wherein:
the third surface joins the first surface, and
the third surface has the second through hole.

6. An atomic oscillator comprising:
a light source;
an atom cell containing a gaseous alkali metal atom, and a nitrogen- and argon-containing buffer gas, and through which light from the light source passes;
a photodetector that detects light having passed through the atom cell; and
a container containing argon gas and housing the atom cell, the container having a first surface, a second surface, a third surface, a fourth surface, a fifth surface, and a sixth surface,
the first surface has a first through hole, and
at least one of the second surface, the third surface, the fourth surface, the fifth surface, and the sixth surface has a second through hole.

7. The atomic oscillator according to claim 6, wherein:
the first through hole is a hole for supplying the argon gas, and
the light source and the atom cell are disposed on the same side of a first imaginary plane as the first through hole, and
the first imaginary plane is a plane that passes through a center of the container, and is parallel to the first surface.

8. The atomic oscillator according to claim 7, wherein the second through hole is disposed on the opposite side of the first imaginary plane from the first through hole.

9. The atomic oscillator according to claim 8, wherein:
the second through hole is positioned on the opposite side of a second imaginary plane from the first through hole, and
the second imaginary plane is a plane that passes through the center of the container, and is perpendicular to the first surface.

10. The atomic oscillator according to claim 9, wherein:
the third surface joins the first surface, and
the third surface has the second through hole.

11. A frequency signal generation system comprising:
an atomic oscillator,
wherein the atomic oscillator includes
   a light source;
   an atom cell containing a gaseous alkali metal atom, and a nitrogen- and argon-containing buffer gas, and through which light from the light source passes;
   a photodetector that detects light having passed through the atom cell; and
   a container containing either nitrogen gas or argon gas and housing the atom cell,
the container has a first surface, a second surface, a third surface, a fourth surface, a fifth surface, and a sixth surface,
the first surface has a first through hole,
at least one of the second surface, the third surface, the fourth surface, the fifth surface, and the sixth surface has a second through hole.

* * * * *